United States Patent [19]

Okamoto et al.

[11] Patent Number: 5,786,112
[45] Date of Patent: Jul. 28, 1998

[54] PHOTOMASK MANUFACTURING PROCESS AND SEMICONDUCTOR INTEGRATED CIRCUIT DEVICE MANUFACTURING PROCESS USING THE PHOTOMASK

[75] Inventors: Yoshihiko Okamoto, Kodaira; Yasuhiro Koizumi, Sayama, both of Japan

[73] Assignee: Hitachi, Ltd., Tokyo, Japan

[21] Appl. No.: 664,865

[22] Filed: Jun. 17, 1996

[30] Foreign Application Priority Data

Jun. 19, 1995 [JP] Japan ................... 7-152088

[51] Int. Cl.⁶ .................................. G03F 9/00
[52] U.S. Cl. .................................. 430/5; 430/22
[58] Field of Search .................... 430/5, 22; 356/390

[56] References Cited

U.S. PATENT DOCUMENTS 5,353,116 10/1994 Tanigawa et al. ............... 356/390
5,481,624 1/1996 Kamon .......................... 382/144

FOREIGN PATENT DOCUMENTS

| 62-59296 | 12/1987 | Japan . |
|---|---|---|
| 4-229863 | 8/1992 | Japan . |
| 4-321047 | 11/1992 | Japan . |
| 4-328549 | 11/1992 | Japan . |
| 4-345163 | 12/1992 | Japan . |
| 6-35171 | 2/1994 | Japan . |

*Primary Examiner*—S. Rosasco
*Attorney, Agent, or Firm*—Fay, Sharpe, Beall, Fagan, Minnich & McKee

[57] ABSTRACT

In order to improve the inspection efficiency of a photomask having a phase shifter pattern, the inspection of the photomask having the phase shifter pattern is divided into three steps, an anomaly extraction step, a first anomaly discrimination step and a second anomaly discrimination step. These inspection steps are performed at different inspection regions. An anomaly extraction station 7 for the anomaly extraction inspects the presence or absence of an anomaly for all the regions of the photomask 1. An anomaly discrimination station 8 for the anomaly discrimination classifies the content of the anomaly. A phase difference measurement station 9 for the anomaly discrimination measures the phase difference error.

17 Claims, 26 Drawing Sheets

[NORMAL PORTION]

[DEFECTIVE PORTION]

PHOTOMASK MANUFACTURING PROCESS AND SEMICONDUCTOR INTEGRATED CIRCUIT DEVICE MANUFACTURING PROCESS USING THE PHOTOMASK

BACKGROUND OF THE INVENTION

The present invention relates to a process for manufacturing a photomask and a technique for manufacturing a semiconductor integrated circuit device by using the photomask and, more particularly, to a technique effective if applied to a process for inspecting a photomask having a phase shifter.

As the miniaturization of a semiconductor integrated circuit device advances so far that the design rules for circuit elements and wiring lines reaches a sub-micron order, a reduction in the pattern transfer accuracy raises a serious problem in the photolithography process for transferring an integrated circuit pattern on a photomask to a semiconductor wafer with a light of the i-line (having a wavelength of 365 nm).

As the means for solving that problem, there has been noted a phase shift technique for preventing the drop in the contrast of a projected image by changing the phase of the light to be transmitted by a mask.

In Japanese Patent Publication No. 59296/1987, for example, there is disclosed the phase shift technique for weakening the optical intensity of the boundary of two lights on a semiconductor wafer by providing a phase shifter in one of paired openings across a shield region on the mask such that the phases of the two lights, as transmitted by the paired openings, are reversed from each other.

In this phase shift exposure technique, when a pattern composed of an optically transparent region and a shield region over a mask (or reticule) is to be transferred to the semiconductor, a phase shifter, as formed of a transparent film having a predetermined refractive index, is arranged in one of paired optically transparent regions adjacent to each other and is so adjusted in its film thickness that the phases of the two lights just having passed through those transparent regions may be reversed from each other. As a result, the two lights interfere with each other at their boundary over the semiconductor wafer and weaken each other so that the contrast of the projected image of the pattern is drastically improved to improve the pattern transfer accuracy.

As to the inspection to be used in such phase shift exposure technique, even a remarkably fine mask defect is transferred to require a highly accurate technique for inspection and correction. Thus, the inspection is made more troublesome with the improvement of the pattern transfer accuracy.

As to this mask inspecting technique, there is disclosed a technique in which a reticule having a phase shift film pattern is inspected in one inspecting apparatus by the step of extracting a defective region of the reticule and by the step of specifying the defective portion of the defective region, as disclosed in Japanese Patent Laid-Open No. 321047/1992, for example.

In Japanese Patent Laid-Open No. 345163/1992, on the other hand, there is disclosed a technique in which a pattern on a phase shift mask is inspected by preparing three kinds of re-size data from the data of a shield pattern and by comparing a resultant reference pattern and the pattern of an actual photomask.

In Japanese Patent Laid-Opens No. 229863/1992 and No. 229864/1992, on the other hand, there is disclosed an inspecting apparatus for inspecting a phase change in a phase shift photomask.

In Japanese Patent Laid-Open No. 328549/1992, on the other hand, there is disclosed a technique for detecting a foreign substance such as a transparent film by collating a focused image, an image obtained by defocusing in a forward pin direction within the range of several times of the focal depth, and an image obtained by defocusing in a backward pin direction within the range of several times of the focal depth.

In Japanese Patent Laid-Open No. 35171/1994, moreover, there is disclosed a technique for verifying the pattern data of a phase shift mask.

SUMMARY OF THE INVENTION

The phase shift film of such phase shift mask is exemplified from the standpoint of easy formation by a transparent insulating film which is formed by the SOG (Spin On Glass) method or the like. If the phase shift film is formed in this case over a metal film forming a shield pattern, its thickness may be locally different from the designed value due to the step in the metal film or a foreign substance on the metal film so that the phase difference changes to cause problems of a dislocation defect and a drop in the focal depth.

There is a mask substrate of the type in which the shifter is formed below a shielding chromium film. In this case, a transparent film, as having a predetermined thickness and formed over a quartz substrate, has to be coated with a shielding film. However, a number of fine defects may appear in the quartz substrate, and the shielding film may be partially scraped to form defects even after the pattern has been formed.

In view of these points, it is necessary to inspect the mask substrate having the phase shift pattern. This inspection technique grows the more important and requires the higher inspection accuracy as the finer transfer pattern is required.

As this point, we have found the following problems in the technique of inspecting a photomask (as will be called the "phase shift mask") having the aforementioned phase shifter pattern.

The technique disclosed in Japanese Patent Laid-Open No. 321047/1992, for example, is not suitable for inspecting a plurality of phase shift masks or the like efficiently because the inspections are carried out in one inspecting apparatus.

Moreover, what is disclosed in Japanese Patent Laid-Opens No. 229863/1992 and No. 229864/1992 is the technique for inspecting only the phase change but fails to investigate the efficient inspection of the phase shift mask including other inspections.

On the other hand, disclosed in Japanese Patent Laid-Open No. 348549/1992 is the technique capable of detecting a transparent foreign substance satisfactorily but fails to investigate the efficient inspection of the phase shift mask including other inspections.

On the other hand, the technique, as disclosed in Japanese Patent Laid-Open No. 345163/1992, for example, cannot be applied to the case in which the edge portion of a phase shifter pattern is in the transparent region. For example, the decision may mistake a satisfactory pattern as defective.

Moreover, the technique, as disclosed in Japanese Patent Laid-Open No. 35171/1994, for example, can be applied to a structure, in which a phase shifter is formed in all the transparent regions of a mask, but not to the case in which the edge portion of the phase shifter is in the transparent region. For example, the decision may mistake a satisfactory pattern as defective.

As to the discrimination in the transparent region in which the edge portion of the phase shifter pattern is arranged, according to the technique investigated by us, whether or not the region of the fine pattern is satisfactory is decided such that the inspector observes the patterns one by one. This causes a problem that the inspection takes time thereby deteriorating the inspection efficiency.

An object of the present invention is to provide a technique capable of improving the inspection efficiency of a photomask having a phase shifter pattern.

Another object of the present invention is to provide a technique capable of improving the inspection accuracy of the photomask having the phase shifter pattern.

Still another object of the present invention is to provide a technique capable of inspecting the photomask in which the edge portion of the phase shifter pattern is in a transparent region.

The foregoing and other objects and novel features of the present invention will become apparent from the following description to be made with reference to the accompanying drawings.

A representative to be disclosed herein will be briefly described in the following.

According to the present invention, there is provided a process for manufacturing a photomask having a phase shifter pattern on a mask substrate for establishing a phase difference in transmitted lights, wherein said mask substrate is inspected on independent inspection stages at the following steps:

(a) the step of extracting an anomalous portion on said mask substrate by comparing and collating the actually measured pattern data, which are obtained by applying an inspection light to said mask substrate to detect either the light having passed through said mask substrate or the light reflected by said mask substrate, and at least one of the pattern data, which is the original of the mask pattern to be formed on said mask substrate, and the pattern data of a different region on said mask substrate;

(b) a first decision step of discriminating and classifying the anomalous content of an anomalous portion, which is extracted by said anomalous portion extracting step, and deciding the presence or absence of an anomaly relating to said phase shifter pattern; and (c) a second decision step of deciding the suitability of said phase shifter pattern by measuring and inspecting the phase difference of said mask substrate.

According to the present invention, moreover, a photomask manufacturing process according to claim 1, wherein the inspection of the mask substrate having the predetermined transparent region, in which the edge portion of said phase shifter pattern is arranged, includes the following steps:

(a) the step of inspecting whether or not the boundary region of the edge portion of said phase shifter pattern is present in the transparent region on said mask substrate;

(b) the step of dividing the pattern of the transparent region on the data across said boundary region if said boundary region is present;

(c) the step of inspecting, after said transparent region dividing step, the data of the pattern interval as to the pattern on said mask substrate and inspecting whether or not the interval is longer than the predetermined interval necessary for transferring the pattern;

(d) the step of deciding an anomaly, if it is decided that said interval is longer than the predetermined value, and inspecting, if it is decided that said interval is shorter than the predetermined value, whether or not said phase shifter pattern is present in one of the pattern decided less than said predetermined value, with reference to the data of said phase shifter pattern; and (e) the step of deciding that the pattern is normal, if it is decided that said phase shifter pattern is present in one of the patterns decided to be less than said predetermined value, and that the pattern is defective if it is decided that said phase shifter pattern is not present.

According to the present invention, still moreover, there is provided a photomask manufacturing process according to claim 1, further comprising the following steps:

(a) the step of digging grooves for said phase shifter pattern in said mask substrate to a depth of about 90% of that necessary for said grooves by the dry etching method;

(b) the step of measuring the phase difference between the lights which have passed through both the phase shifter pattern groove regions dug in said mask substrate and the unetched regions;

(c) the step of calculating the extent of digging the grooves again on the basis of the error between said phase difference and the predetermined phase difference which is obtained when said grooves have a desired depth; and (d) the step of using the wet etching method for digging said grooves on the basis of the calculated amount which is calculated for digging said phase shifter pattern grooves again.

The summary of the present invention will be briefly itemized in the following.

1. A process for manufacturing a photomask (or reticule) having a phase shifter pattern on a mask substrate (including those forming a grooved shifter by cutting or etching a substrate surface, as in the following) for establishing a phase difference in transmitted lights, wherein said mask substrate is inspected on independent inspection stages (as includes the detection of suitability of the phase as to only the portion in which the appearance other than the phase, i.e., the actual appearance has an anomaly at a light or normal level at one stage. Moreover, the individual inspecting units may be integral or may not belong to one apparatus) at the following steps:

(a) the step of extracting an anomalous portion (including a portion required for further inspection) on said mask substrate by comparing and collating the actually measured pattern data (or actual measurement pattern data), which are obtained by applying an inspection light (exemplified by the g-line of a mercury lamp in the case of the reducing projection exposure by the i-line of the mercury lamp. A light of another light source or wavelength can be used. There may be employed a monochromatic light having the same wavelength as or a longer or shorter wavelength than that of the exposure light. Moreover, the inspection light should not be limited to the monochromatic one but can be exemplified, if necessary, by a quasi-monochromatic light having a predetermined band width or a wide light.) to said mask substrate to detect either the light having passed through said mask substrate or the like reflected by said mask substrate, and at least one of the pattern data (or mask pattern data), which is the original of the mask pattern to be formed on said mask substrate, and the pattern data (or pattern data of the same shape and region, i.g., identical type pattern data)

of a different region but to have an identical shape on said mask substrate;

(b) a first decision step (which need not be especially provided but it can be automatically decided at a preceding inspection step that an anomaly over a predetermined level is an actual one. Moreover, it may also be automatically or selectively decided that an anomaly of a predetermined condition is one to be further inspected.) of discriminating and classifying the anomalous content of an anomalous portion, which is extracted by said anomalous portion extracting step, and deciding the presence or absence of an anomaly relating to said phase shifter pattern; and (c) a second decision step of deciding the suitability of said phase shifter pattern by measuring and inspecting the phase difference of said mask substrate (including an analog measurement or a quasi-analog measurement of the phase difference).

2. A photomask manufacturing process according to numbered paragraph 1, wherein said anomalous portion extracting step includes the following steps:

(a) the step of detecting, by applying the inspection light to said mask substrate, either the light having passed through said mask substrate or the light reflected from said mask substrate by means of an image sensor;

(b) the step of preparing two-dimensional map shaped pixel data on the basis of the actually measured pattern data obtained by said image sensor; and (c) the step of extracting an anomalous portion on said mask substrate by comparing and collating said pixel data with at least one of the pixel data, which are obtained on the basis of the pattern data of the origin of the mask pattern to be formed on said mask substrate and the pixel data which are obtained on the basis of the pattern data of a different region on said mask substrate.

3. A photomask manufacturing process according to numbered paragraph 1, wherein said anomalous content of said first propriety decision step is a cutout defect of a shield pattern, a residual defect of the shield pattern, a cutout defect of the phase shifter pattern, a residual defect of the phase shifter pattern, an anomaly due to an attached foreign substance, sizes of the shield pattern and the phase shifter pattern, overlap errors of the shield pattern and the phase shifter pattern, or a phase difference error of the transmitted light.

4. A photomask manufacturing process according to numbered paragraph 1, wherein the inspection of the mask substrate having the predetermined transparent region, in which the edge portion of said phase shifter pattern is arranged, includes the following steps:

(a) the step of preparing the actually measured individual pattern data of the transparent region having the edge portion of a satisfactory shield pattern in said mask substrate and the transparent region having the edge portion of a satisfactory phase shifter pattern, by applying the inspection light to the individual transparent regions to detect either the light having passed through said mask substrate or the light reflected from said mask substrate;

(b) the bias value determining step of determining the values of the width of the shield pattern decided satisfactory and the width of the boundary region of the phase shifter pattern decided satisfactory, by comparing the actually measured individual pattern data with both the pattern data of the transparent region having the edge portions of the shield patterns corresponding to the actually measured individual pattern data and the pattern data of the boundary region of the phase shifter pattern; and (c) the step of extracting an anomalous portion of the pattern on said mask substrate by synthesizing the data of the shield pattern, which is set by the width determined at said bias value determining step, and the data of said phase shifter pattern, and by comparing and collating the synthesized pattern data with the data of the pattern on said mask substrate, as actually detected.

5. A photomask manufacturing process according to numbered paragraph 1, wherein the inspection of the mask substrate having the predetermined transparent region, in which the edge portion of said phase shifter pattern is arranged, includes the following steps:

(a) the step of inspecting whether or not the boundary region of the edge portion of said phase shifter pattern is present in the transparent region on said mask substrate;

(b) the step of dividing the pattern of the transparent region on the data across said boundary region if said boundary region is present;

(c) the step of inspecting, after said transparent region dividing step, the data of the pattern interval as to the pattern on said mask substrate and inspecting whether or not the interval is longer than the predetermined interval necessary for transferring the pattern;

(d) the step of deciding an anomaly, if it is decided that said interval is longer than the predetermined value, and inspecting, if it is decided that said interval is shorter than the predetermined value, whether or not said phase shifter pattern is present in one of the pattern decided less than said predetermined value, with reference to the data of said phase shifter pattern; and (e) the step of deciding that the pattern is normal, if it is decided that said phase shifter pattern is present in one of the patterns decided to be less than said predetermined value, and that the pattern is defective if it is decided that said phase shifter pattern is not present.

6. A photomask manufacturing process according to numbered paragraph 1, further comprising the following steps:

(a) the step of digging grooves for said phase shifter pattern in said mask substrate to a depth of about 90% of that necessary for said grooves by the dry etching method;

(b) the step of measuring the phase difference between the lights which have passed through both the phase shifter pattern groove regions dug in said mask substrate and the unetched regions;

(c) the step of calculating the extent of digging the grooves again on the basis of the error between said phase difference and the predetermined phase difference which is obtained when said grooves have a desired depth; and (d) the step of using the wet etching method for digging said grooves on the basis of the calculated amount which is calculated for digging said phase shifter pattern grooves again.

7. A photomask manufacturing process according to numbered paragraph 1, further comprising the following steps:

(a) the step of digging grooves for said phase shifter pattern in said mask substrate to a depth of about 90% of that necessary for said grooves with a focused ion beam;

(b) the step of measuring the phase difference between the lights which have passed through both the phase shifter pattern groove regions dug in said mask substrate and the unetched regions;

(c) the step of calculating the extent of digging the grooves again on the basis of the error between said phase difference and the predetermined phase difference which is obtained when said grooves have a desired depth; and (d) the step of digging said grooves on the basis of the calculated amount which is calculated for digging said phase shifter pattern grooves again, by applying the focused ion beam having a reduced damage amount.

8. A photomask manufacturing process according to numbered paragraph 7, wherein said second focused ion beam is applied while feeding a xenon fluoride gas to the region to be irradiated with the ion beam.

9. A photomask manufacturing process, wherein the inspection of a mask substrate (as will be called the "shifter edge mask type phase shift mask") having a transparent region, in which the edge portion of a phase shifter pattern for establishing a phase difference in transmitted lights is arranged, comprises the following steps:

(a) the step of preparing the actually measured individual pattern data of the transparent region having the edge portion of a satisfactory shield pattern in said mask substrate and the transparent region having the edge portion of a satisfactory phase shifter pattern, by applying the inspection light (identical to that of the foregoing Item 1) to the individual transparent regions to detect either the light having passed through said mask substrate or the light reflected from said mask substrate;

(b) the bias value determining step of determining the values of the width (or the bias value) of the shield pattern decided satisfactory and the width (or the bias value for the portion shielded by the shifter edge, i.e., for the shifter edge mask portion) of the boundary region of the phase shifter pattern decided satisfactory, by comparing the actually measured individual pattern data with both the pattern data of the transparent region having the edge portions of the shield patterns corresponding to the actually measured individual pattern data and the pattern data of the boundary region of the phase shifter pattern; and (c) the step of extracting an anomalous portion of the pattern on said mask substrate by synthesizing the data of the shield pattern, which is set by the width determined at said bias value determining step, and the data of said phase shifter pattern, and by comparing and collating the synthesized pattern data (or the reference mask pattern data for the inspection) with the data of the pattern on said mask substrate, as actually detected.

10. A photomask manufacturing process, wherein the inspection of the mask substrate having a transparent region, in which the edge portion of a phase shifter pattern for establishing a phase difference in transmitted lights is arranged, includes the following steps:

(a) the step (or shifter edge detection step) of inspecting whether or not the boundary region of the edge portion of said phase shifter pattern is present in the transparent region on said mask substrate;

(b) the step (or data division step) of dividing the pattern of the transparent region on the data across said boundary region if said boundary region is present;

(c) the step of inspecting, after said transparent region dividing step, the data of the pattern interval as to the pattern on said mask substrate and inspecting whether or not the interval is longer than the predetermined interval necessary for transferring the pattern;

(d) the step of deciding an anomaly, if it is decided that said interval is longer than the predetermined value, and inspecting, if it is decided that said interval is shorter than the predetermined value, whether or not said phase shifter pattern is present in one of the pattern decided less than said predetermined value, with reference to the data of said phase shifter pattern; and (e) the step of deciding that the pattern is normal, if it is decided that said phase shifter pattern is present in one of the patterns decided to be less than said predetermined value, and that the pattern is defective if it is decided that said phase shifter pattern is not present.

11. A process for manufacturing a semiconductor integrated circuit device, when a predetermined semiconductor integrated circuit pattern is to be transferred to a semiconductor wafer by using a photomask having a phase shifter pattern on a mask substrate for establishing a phase difference in transmitted lights, comprising the following steps:

(a) the step of extracting an anomalous portion on the mask substrate, which is placed on a first inspection stage, by comparing and collating the actually measured pattern data, which are obtained by applying an inspection light to said mask substrate to detect either the light having passed through said mask substrate or the like reflected by said mask substrate, and at least one of the pattern data, which is the original of the mask pattern to be formed on said mask substrate, and the pattern data of a different region on said mask substrate;

(b) a first decision step of discriminating and classifying, after said mask substrate has been placed on a second inspection stage, the anomalous content of an anomalous portion, which is extracted by said anomalous portion extracting step, and deciding the presence or absence of an anomaly relating to said phase shifter pattern;

(c) a second decision step of deciding the suitability of said phase shifter pattern by measuring and inspecting the phase difference of said mask substrate after said mask substrate has been placed on a third inspection stage;

(d) a step of correcting the defect which is discovered by said inspection step; and (e) the step of transferring the predetermined semiconductor integrated circuit pattern to a resist film applied to said semiconductor wafer, by applying the exposure light to the semiconductor wafer through said photomask after an exposure system has been loaded with the corrected photomask.

12. A semiconductor integrated circuit device manufacturing process according to numbered paragraph 11, wherein the semiconductor integrated circuit device is to be manufactured by using the photomask having the predetermined transparent region, in which the edge portion of said phase shifter pattern is arranged, further comprising the following steps:

(a) the step of preparing the actually measured individual pattern data of the transparent region having the edge portion of a satisfactory shield pattern in said mask substrate and the transparent region having the edge portion of a satisfactory phase shifter pattern, by applying the inspection light to the individual transparent regions to detect either the light having passed through said mask substrate or the light reflected from said mask substrate;

(b) the bias value determining step of determining the values of the width of the shield pattern decided satisfactory and the width of the boundary region of the phase shifter pattern decided satisfactory, by comparing the actually measured individual pattern data with both the pattern data of the transparent region having the edge portions of the shield patterns corresponding to the actually measured individual pattern data and the pattern data of the boundary region of the phase shifter pattern; and (c) the step of extracting an anomalous portion of the pattern on said mask substrate by synthesizing the data of the shield pattern, which is set by the width determined at said bias value determining step, and the data of said phase shifter pattern, and by comparing and collating the synthesized pattern data with the data of the pattern on said mask substrate, as actually detected.

13. A semiconductor integrated circuit device manufacturing process according to numbered paragraph 11, wherein the semiconductor integrated circuit device is to be manufactured by using the photomask having the predetermined transparent region, in which the edge portion of said phase shifter pattern is arranged, further comprising the following steps:

(a) the step of inspecting whether or not the boundary region of the edge portion of said phase shifter pattern is present in the transparent region on said mask substrate;

(b) the step of dividing the pattern of the transparent region on the data across said boundary region if said boundary region is present;

(c) the step of inspecting, after said transparent region dividing step, the data of the pattern interval as to the pattern on said mask substrate and inspecting whether or not the interval is longer than the predetermined interval necessary for transferring the pattern;

(d) the step of deciding an anomaly, if it is decided that said interval is longer than the predetermined value, and inspecting, if it is decided that said interval is shorter than the predetermined value, whether or not said phase shifter pattern is present in one of the pattern decided less than said predetermined value, with reference to the data of said phase shifter pattern; and (e) the step of deciding that the pattern is normal, if it is decided that said phase shifter pattern is present in one of the patterns decided to be less than said predetermined value, and that the pattern is defective if it is decided that said phase shifter pattern is not present.

14. A semiconductor integrated circuit device manufacturing process according to numbered paragraph 11, further comprising the following steps:

(a) the step of digging grooves for said phase shifter pattern in said mask substrate to a depth of about 90% of that necessary for said grooves by the dry etching method;

(b) the step of measuring the phase difference between the lights which have passed through both the phase shifter pattern groove regions dug in said mask substrate and the unetched regions;

(c) the step of calculating the extent of digging the grooves again on the basis of the error between said phase difference and the predetermined phase difference which is obtained when said grooves have a desired depth; and (d) the step of using the wet etching method for digging said grooves on the basis of the calculated amount which is calculated for digging said phase shifter pattern grooves again.

15. A semiconductor integrated circuit device manufacturing process according to numbered paragraph 11, further comprising the following steps:

(a) the step of digging grooves for said phase shifter pattern in said mask substrate to a depth of about 90% of that necessary for said grooves with a focused ion beam;

(b) the step of measuring the phase difference between the lights which have passed through both the phase shifter pattern groove regions dug in said mask substrate and the unetched regions;

(c) the step of calculating the extent of digging the grooves again on the basis of the error between said phase difference and the predetermined phase difference which is obtained when said grooves have a desired depth; and (d) the step of digging said grooves on the basis of the calculated amount which is calculated for digging said phase shifter pattern grooves again, by applying the focused ion beam having a reduced damage amount.

16. A process for manufacturing a phase shift mask (including the normal phase shift mask basically having no shifter edge in a transparent region, and an edge mask type phase shift mask arranging the shifter edge in the transparent region and using it as a shield region) to manufacture a semiconductor integrated circuit device by the reducing projection exposure (including the so-called "exposure using the stepper" and the step and scan type), comprising the following steps:

(a) the actual intensity distribution acquiring step of acquiring the substantially planar intensity distribution data (including the shading data by the phase shifter but substantially not the analog phase data such as the data of the hotness of the phase shift portion) of a transmitted light and a reflected light by placing a first phase shift mask, which is patterned with a first final product mask (not an inspecting pattern but an actual product pattern) pattern corresponding to an integrated circuit pattern composed of a chromium opening region (or actual opening region) and a phase shift region (including a grooved shifter formed by digging the substrate, and an overlying or underlying type filter phase shifter) and adapted to be transferred to a wafer, on a first wafer stage of a first inspection unit and by applying a first inspection light to said mask pattern to detect said transmitted light and said reflected light;

(b) the selective phase anomaly detection step (by which a long time period required for the analog inspection of the phase shifter can be spared) of detecting the presence or absence of the anomaly of a phase shift value, simultaneously at least partially with said step (a) for said first mask, by placing a second phase shift mask, which is patterned with said first final product mask pattern or a second final product mask pattern corresponding to an integrated circuit pattern composed of the chromium opening region and the phase shift region, as having been subjected to said actual intensity distribution acquiring step, and adapted to be transferred to the wafer, on a second wafer stage of said first inspection unit or a second inspection unit, and by applying said first inspection light or a second inspection light to such a phase anomaly candidate portion of at least the phase shift region of said mask pattern as may highly possibly be anomalous to satisfy a predetermined condition according to the result of the preceding actual intensity distribution acquiring step, to detect the transmitted light or the reflected light; and (c) the phase defect correcting step of correcting at least partially such a portion of the phase shift region of said second mask as is anomalous in the phase shift value, on the basis of at least said selective phase anomaly detection step.

17. A process for manufacturing a phase shift mask to manufacture a semiconductor integrated circuit device by the reducing projection exposure, comprising the following steps:

(a) the actual intensity distribution acquiring step of acquiring the substantially planar intensity distribution data of a transmitted light and a reflected light by placing a first phase shift mask, which is patterned with a first final product mask pattern corresponding to an integrated circuit pattern composed of a chromium opening region and a phase shift region and adapted to be transferred to a wafer, on a first wafer stage of a first inspection unit and by applying a first inspection light to said mask pattern to detect said transmitted light and said reflected light;

(b) the selective phase anomaly detection step of detecting the presence or absence of the anomaly of a phase shift value by placing said first phase shift mask on said first wafer stage or a second wafer stage of said first inspection unit or a second inspection unit, and by applying said first inspection light or a second inspection light to such a phase anomaly candidate portion of at least the phase shift region of said mask pattern as may highly possibly be anomalous to satisfy a predetermined condition according to the result of the preceding actual intensity distribution acquiring step, to detect the transmitted light or the reflected light; and (c) the phase defect correcting step of correcting at least partially such a portion of the phase shift region of said first mask as is anomalous in the phase shift value, on the basis of at least said selective phase anomaly detection step.

18. A process for manufacturing an edge mask type phase shift mask, which has an edge mask pattern using a shifter edge in a transparent region as a shield mask, to manufacture a semiconductor integrated circuit device by the reducing projection exposure, comprising the following steps:

(a) the actual intensity distribution acquiring step of acquiring the substantially planar intensity distribution data of a transmitted light and a reflected light by placing a first phase shift mask, which is patterned with a first final product mask pattern corresponding to an integrated circuit pattern composed of at least a chromium opening region and an edge mask pattern region and adapted to be transferred to a wafer, on a first wafer stage of a first inspection unit and by applying a first inspection light to said mask pattern to detect said transmitted light and said reflected light;

(b) the edge mask pattern comparison and inspection step of detecting an anomaly of said edge mask pattern region, after said actual intensity distribution acquiring step, by comparing the actual intensity distribution data obtained at said actual intensity distribution acquiring step and the inspecting reference mask pattern data (for generating the inspecting pattern with a width corresponding to the shield pattern, which might be obtained if correct, because the exposure light and the inspection light are not always identical with a difference in the optical system so that the width of the shield pattern obtained on the wafer at the portion corresponding to the shifter edge is different from that of the designed device pattern) prepared by converting the edge mask pattern region of mask design data into a shield pattern having a predetermined width; and (c) the phase shifter edge portion defect correcting step of correcting at least partially such a portion of the edge mask pattern region of said first mask as is anomalous in the phase shift value, on the basis of at least said edge mask pattern comparison and inspection step.

19. A process for manufacturing a semiconductor integrated circuit device, comprising the following steps:

(a) the actual intensity distribution acquiring step of acquiring the substantially planar intensity distribution data of a transmitted light and a reflected light by placing a first phase shift mask, which is patterned with a first final product mask pattern corresponding to an integrated circuit pattern composed of at least a chromium opening region and a gate electrode pattern region using a shifter edge in a transparent region as a shield mask and adapted to be transferred to a wafer, on a first wafer stage of a first inspection unit and by applying a first inspection light to said mask pattern to detect said transmitted light and said reflected light;

(b) the edge mask pattern comparison and inspection step of detecting an anomaly of said edge mask pattern region, after said actual intensity distribution acquiring step, by comparing the actual intensity distribution data obtained at said actual intensity distribution acquiring step and the inspecting reference mask pattern data prepared by converting the edge mask pattern region of mask design data into a shield pattern having a predetermined width;

(c) the phase shifter edge portion defect correcting step of correcting at least partially such a portion of the edge mask pattern region of said first mask as is anomalous in the phase shift value, on the basis of at least said edge mask pattern comparison and inspection step; and (d) the reducing projection exposure step of transferring the gate electrode pattern on said firs mask, as corrected at said phase shifter edge portion defect correcting step, to said wafer by the reducing projection exposure using a monochromatic or quasi-monochromatic violet light as the exposure light.

By dividing the step of inspecting the photomask, according to the aforementioned photomask manufacturing process of the present invention, a plurality of photomasks can be so separately inspected that an arbitrary photomask can be inspected at the anomaly extracting step, that another photomask having ended the anomaly extracting step can be inspected at the first decision step, and that still another photomask having ended the anomaly extracting step can be inspected at the second decision step. As a result, the inspection of the photomask can be prevented from stagnating at one inspection step so that the plurality of photomasks can be efficiently executed.

Thanks to the divided individual inspection steps, moreover, the inspecting optical systems can be arranged suitably for the individual inspections so that the inspection accuracies at the individual inspection steps can be drastically improved.

Thanks to the divided individual inspection steps, moreover, the data can be divided for the individual inspection steps to lighten the loads upon the data in the inspecting apparatus. As a result, the data processing rate can be improved to improve the inspection efficiency.

Thanks to the divided individual inspection steps, moreover, it is possible to eliminate the unnecessary inspections. If the anomaly extraction step encounters the case, in which it is decided that no subsequent inspection is required, or the case in which there is discovered a region requiring no subsequent inspection, it is possible by transmitting the data to the first decision step or the second decision step to eliminate the first decision step and the second decision step all over the region of the photomask or in a partial region of the photomask.

According to the process for manufacturing the photomask of the present invention, moreover, when the mask substrate having a predetermined transparent region, in which the edge portion of the phase shifter pattern is arranged, is to be inspected, there are prepared the data of the pattern, in which the transparent region is divided, and it is inspected whether or not the phase shifter pattern is present in one of the divided regions. As a result, it is possible to prevent the erroneous inspection which might otherwise decide that the pattern is defective due to the fact that the pattern interval is less than the exposable interval. As a result, the inspection of the photomask having the phase shifter pattern can be executed without deciding that the transparent region, in which the edge portion of the phase shifter pattern is to be arranged, is not defective.

According to the process for manufacturing the photomask of the present invention, moreover, at the inspection of the photomask, in the transparent region in which the edge portion of the phase shifter pattern is arranged, the width of the pattern in the boundary region between the light having passed through the phase shifter pattern and the light having passed through the transparent region not having the phase shifter pattern. On the basis of this, the data of a deciding pattern are prepared so that the erroneous inspection to misjudge a defect due to the different widths for the individual products can be prevented. As a result, the inspection of the photomask having the phase shifter pattern can be executed without deciding that the transparent region, in which the edge portion of the phase shifter pattern, is defective.

DETAILED DESCRIPTION OF THE INVENTION

Embodiments of the present invention will be described in detail in the following with reference to the accompanying drawings.

[EMBODIMENT 1]

A photomask (or reticule) of Embodiment 1 is used to transfer a predetermined integrated circuit pattern to a semiconductor wafer, for example, at an exposure step of a process for manufacturing a semiconductor integrated circuit device. On this photomask, there is formed an original of an integrated circuit pattern which is five times as large as the actual size, for example. Incidentally, this integrated circuit pattern is transferred to the semiconductor wafer by a reducing projection optical system, as will be described hereinafter.

Figure 2:
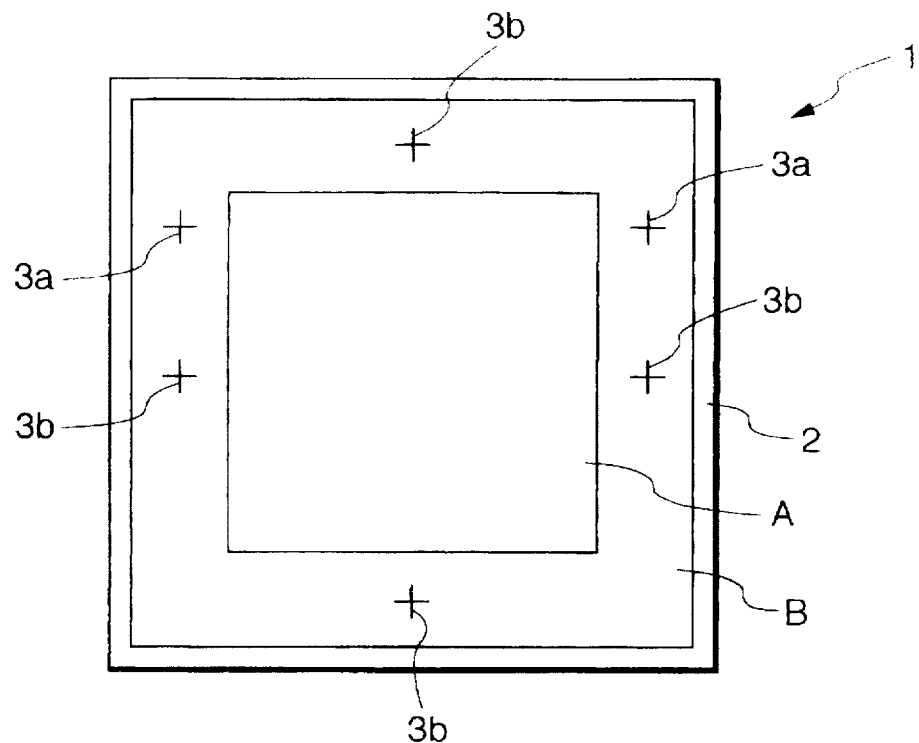
FIG. 2 is a top plan view of the photomask.

The photomask of Embodiment 1 is shown in top plan view in FIG. 2. The photomask, as designated by 1, is made of a mask substrate 2 having a square shape in top plan view as a parent body, for example. The mask substrate 2 is made of a transparent material such as synthesized quartz glass having a refractive index of about 1.47.

The square region, as located at the center of the principal face of the mask substrate 2, is a transfer region A. On this transfer region A, there is formed an original of the predetermined integrated circuit pattern to be transferred. A shielding region B is arranged on the mask substrate 2 around the transfer region A., The shield region B has a plurality of alignment marks 3a and 3b.

Of these alignment marks 3a and 3b, the two alignment marks 3a, as arranged in the vicinity of the two sides of the transfer region A, are used for aligning the exposure apparatus and the photomask 1 in a horizontal plane. On the other hand, the four alignment marks 3b, as arranged at the centers over and below and at the right and left sides of the transfer region A, are used for aligning the photomask 1 and the semiconductor wafer. Both the alignment marks 3a and 3b are formed of cross-shaped transparent regions, for example.

Figure 3:
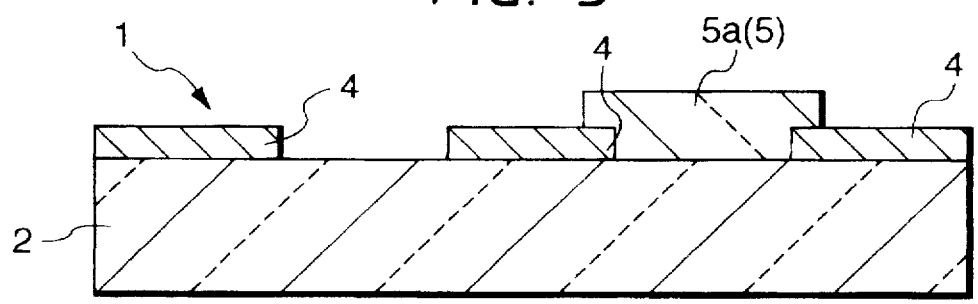
FIG. 3 is a section of an essential portion of the photomask of FIG. 2.
Figure 4:
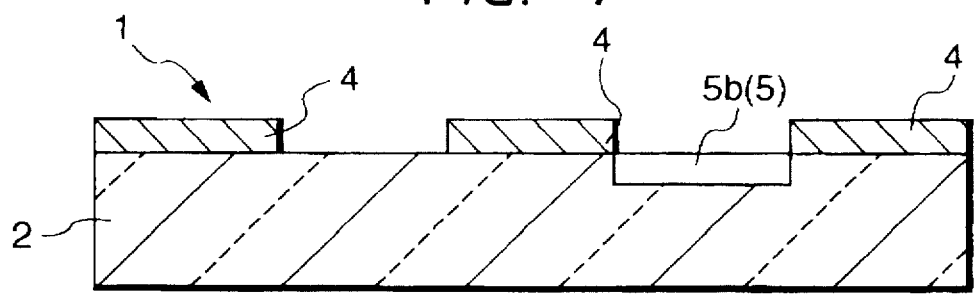
FIG. 4 is a section of an essential portion of another example of the photomask of FIG. 2.

Sections of an essential portion of the transfer region A of that photomask 1 are presented in FIGS. 3 and 4. Over the principal face of the mask substrate 2, there are formed a shield pattern 4 and phase shifter pattern 5, which are given predetermined shapes.

The shield pattern 4 is made of a metal film of chromium (Cr) or the like. The phase shifter pattern 5 may be formed either by coating the mask substrate 2 with a transparent film 5a of $SiO_2$ having a predetermined thickness, for example, or by digging the mask substrate 2 to a groove 5b having a predetermined depth, for example.

In FIG. 5, there are illustrated the amplitude and intensity of the light which is projected from the pattern of the photomask 1 on the resist film over the semiconductor wafer by a reducing projection optical system.

Figure 5A:
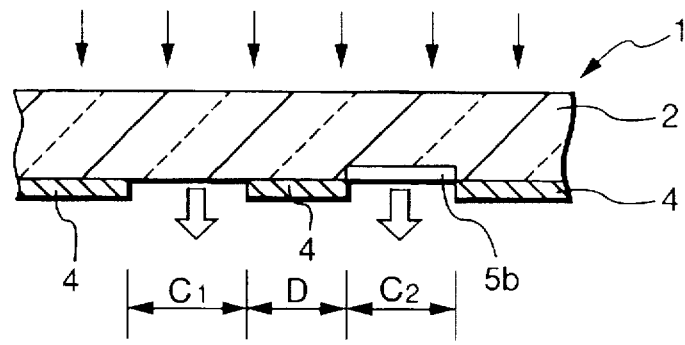
FIGS. 5(A)–5(D) are explanatory diagrams of the amplitude and intensity of the light which is obtained by projecting the pattern of a photomask 1 on a resist film of a semiconductor wafer by a reducing projection optical system.
Figure 5B:
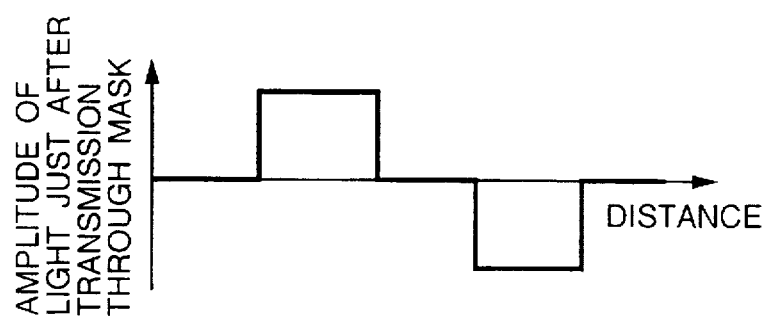
Figure 5C:
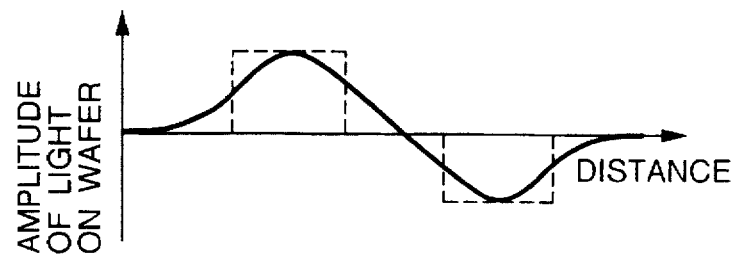
Figure 5D:
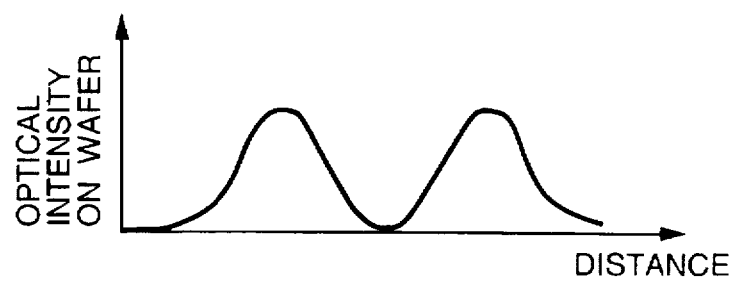

As shown in FIG. 5(a), the photomask 1 of Embodiment 1 is enabled to invert the phase of the transmitted light by the phase shifting groove 5b, which is formed in one of transparent regions C1 and C2 across the shield pattern 4, thereby to form the image of the pattern closer to the exposure wavelength upon the surface of the resist film over the semiconductor wafer through the projecting optical system such as a reducing projection system by making use of the optical interference between the phase and the inverted phase.

The light having passed through such photomask 1 is inverted between the light just after transmission through the transparent region C1 and the light just after transmission through the transparent region C2, as illustrated at (b) in FIG. 5. The light just after transmission through the photomask 1 has an amplitude of square shape, whereas the light on the resist film of the semiconductor wafer has a sinusoidal waveform, as illustrated at (c) in FIG. 5. On the semiconductor wafer, moreover, the two lights of different phases interfere and weaken each other at a shield region D of their boundary so that they take an optical intensity waveform, as illustrated at (d) in FIG. 5. According to this photomask 1, therefore, the function to control the phase difference of the transmitted lights can be so sufficiently fulfilled that the resolution and the focal depth of the projecting exposure can be enhanced to achieve a fine transfer pattern.

Here will be described an inspection of such photomask 1.

The mask inspecting method to be described in the present embodiment is provided for a problem that it grows the more difficult to extract an anomalous portion of the pattern on the photomask 1 her a common state and to discriminate the suitability of the same as the pattern is made the finer.

Therefore, the photomask 1 to be described is assumed to contain thereon, in the course of its manufacture, the cutout or residue of the shield film for forming the shield pattern 4, the cutout or residue of the phase shifter pattern 5, an attached foreign obstacle, or the phase difference error of the transmitted light.

Figure 6:
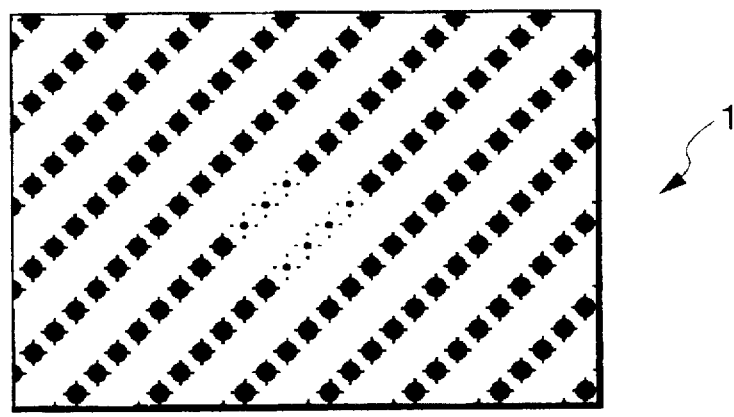
FIG. 6 is an explanatory diagram for explaining a phase difference error.

The phase difference error of the phase shifter pattern, as considered here, is exemplified by an anomaly in FIG. 6. Specifically, this anomaly is such an example as is caused by the phase shifter pattern having partially disappeared during its forming process so that it is difficult to extract and discriminate its content by the ordinary photomask inspecting method.

Figure 7:
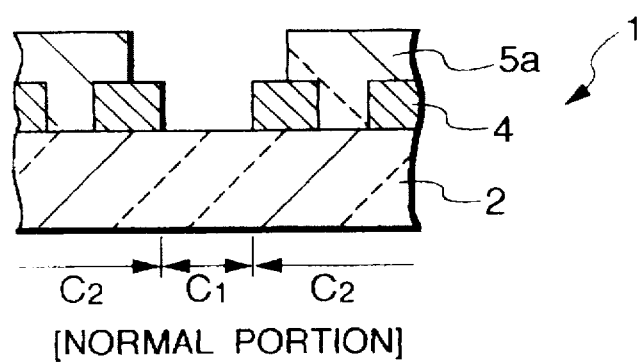
FIG. 7 is a section of an essential portion of a normal portion on the photomask.
Figure 8:
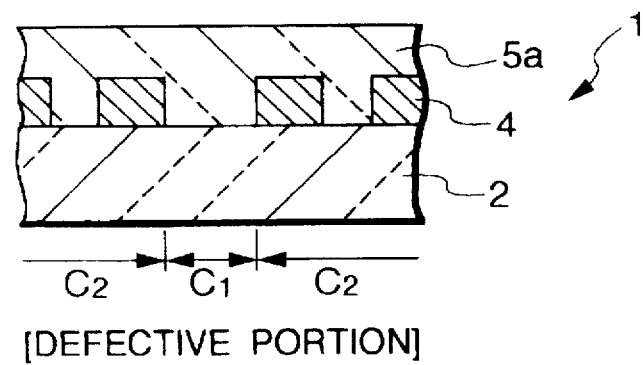
FIG. 8 is a section of an essential portion of an anomalous portion on the photomask.

A section of a normal portion of the photomask 1 is presented in FIG. 7. The predetermined transparent region C2 is coated with the transparent film 5a for forming the phase shifter pattern, whereas the phase shifter pattern forming transparent film 5a is removed from the predetermined transparent region C1 to expose the portion of the mask substrate 2 to the outside. In the anomalous portion of the photomask 1, on the other hand, the region, which should be intrinsically cleared of the phase shifter pattern forming transparent film 5a, is also coated with the transparent film 5a, as shown in FIG. 8.

When the integrated circuit pattern is transferred to the positive type photoresist film over the semiconductor wafer by using the photomask 1 having such an anomaly by means of the reducing projection optical system, the normal portion can form holes having a diameter of about 0.3 µm, for example, whereas the anomalous portion forms holes having a diameter more than 0.4µ, for example, because of divergence of the transmitted light.

In this anomaly, a portion of the phase shifter pattern 5 completely disappears. However, this phase shifter pattern 5 may be partially deformed in the vertical direction. In this case, it is more difficult to extract the anomaly and to discriminate the content.

Figure 9:
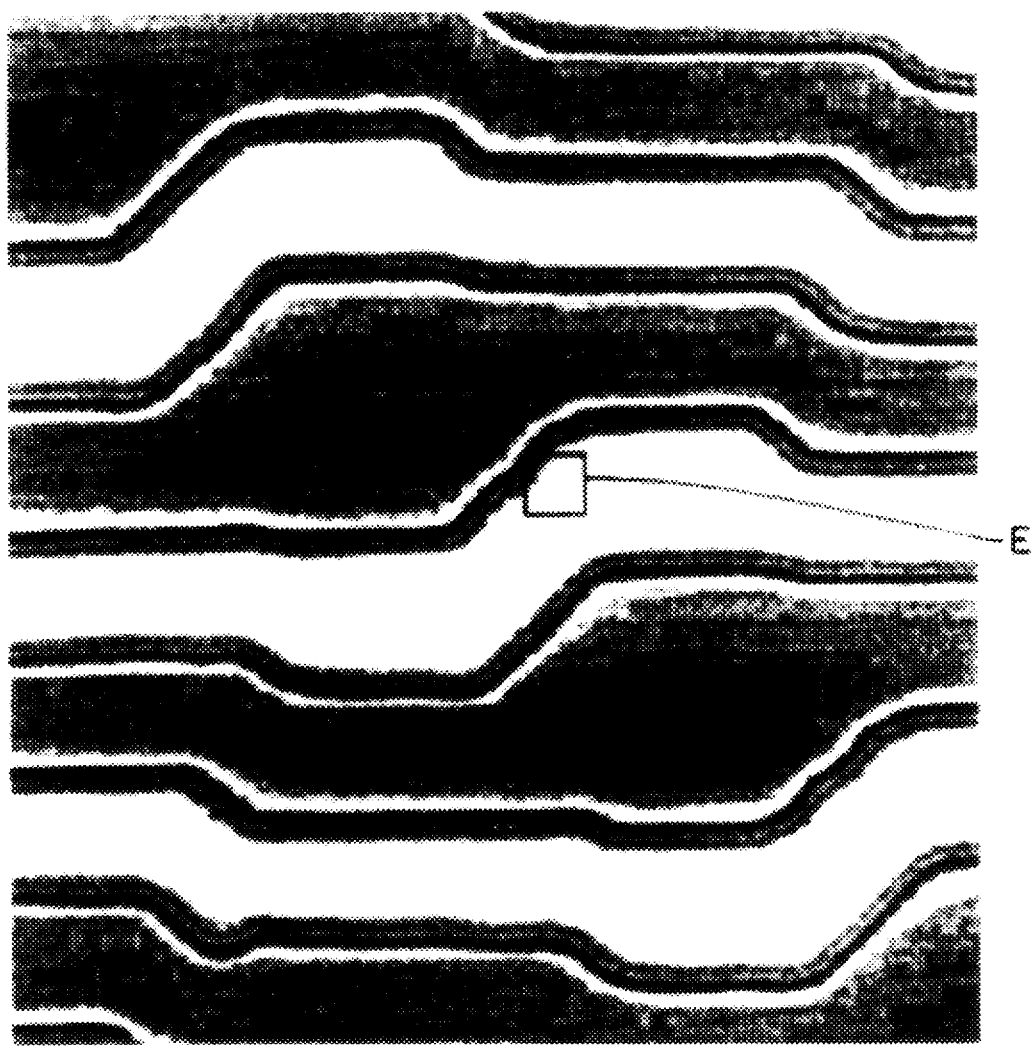
FIG. 9 is a photograph taking a portion of the surface of the photomask by an electron microscope.

FIG. 9 presents one example of a mask pattern (e.g., an integrated circuit pattern) which is formed by the electron beam exposure method. In this pattern, a region E is a step error of an oblique pattern due to the rounding error of a square beam at the time of treating the electron beam exposure. This error has a size of less than 0.2 µm, for example, on the mask.

What raises the problem on this rounding error portion is that a number of defects are extracted if the pattern data obtained by observing the mask pattern are compared and collated with the original design data for forming the mask pattern. In this case, however, it is necessary to discriminate the pattern data as the defects because no influence occurs from the transfer to the semiconductor wafer through the reducing projection optical system. In other words, the extraction of the anomalous portions on the mask substrate 2 and the discrimination of their contents are important in the inspections of the photomask 1 having the phase shifter pattern 5.

An inspecting apparatus to be used in the method of inspecting the photomask 1 of Embodiment 1 will be described in the following with reference to FIG. 1.

An inspecting apparatus 6 of the present embodiment comprises an anomaly extraction station 7, an anomaly discrimination station 8 and a phase difference measurement station 9. These individual stations 7 to 9 are physically separated from one another in respect of their inspection units but are so constructed that they can transfer and share data and can be associated with one another.

The anomaly extraction station 7 is an inspecting mechanism for extracting an anomalous portion on the photomask 1 by inspecting the appearance of the photomask 1, for example, and includes an inspection unit 7A and a data processing unit 7B.

The inspection unit 7A is a component for executing an appearance inspection of the photomask 1 and includes an inspection stage 7A1, a stage drive mechanism 7A2, a laser interferometer 7A3, optical lenses 7A4 and 7A5, a light source 7A6, a reflector 7A7, a sensor 7A8 and a control circuit 7A9.

The inspection stage 7A1 is a stage for placing the photomask 1 thereon. The stage drive mechanism 7A2 is a mechanism for setting the position of the photomask 1 by moving the inspection stage 7A1 in a plane. The laser interferometer 7A3 is a component for detecting the position of the photomask 1 in plane coordinates. The optical lens 7A4 is a lens for condensing the light emitted from the light source 7A6 on the photomask 1, and the optical lens 7A5 is a lens for condensing the light having passed through the photomask 1 on the reflector 7A7.

The light to be emitted from the light source 7A6 is exemplified by a light having a longer wavelength such as 488 nm than that of the exposure light. The reflector 7A7 is a component for applying the light from the optical lens 7A5 to the sensor 7A8. This sensor 7A8 is exemplified by an image sensor such as CCD (Charge Coupled Device) array sensor.

The control circuit 7A9 is a circuit for controlling the operations of the inspection unit 7A. For example, the control circuit 7A9 is enabled to set the planar position of the photomask 1 by driving the stage drive mechanism 7A2. At this time, the control circuit 7A9 calculates the movement of the inspection stage 7A1 by referring to the positional coordinate data of the photomask 1, as detected by the laser interferometer 7A3.

The data processing unit 7B is a component for processing the data detected by the inspection unit 7A and includes a CPU 7B1, a VDT 7B2, a magnetic disk driver 7B3, a communication I/O (Input/Output) port 7B4, data converters 7B5 and 7B6, image memories 7B7 and 7B8, a comparator 7B9, a memory 7B10, a magnetic tape driver 7B11 and an input/output port 7B12.

Incidentally, the CPU 7B1, the VDT 7B2, the magnetic disk driver 7B3, the communication I/O circuit 7B4, the data converter 7B5, the memory 7B10 and the input/output port 7B12 are electrically connected with a data bus DB1.

The CPU 7B1 is a main control unit for controlling the entire operations of the anomaly extraction station 7. The magnetic disk driver 7B3 is a memory for storing data such as the control program of the CPU 7B1 or the integrated circuit pattern.

The communication I/O circuit 7B4 is a circuit for transferring the data between the anomaly extraction station, and the anomaly discrimination station 8 and the phase difference measurement station 9. These individual stations 7 to 9 are electrically connected with one another through the transmission cables by using the communication I/O circuit 7B4 as a data input/output circuit.

The data converter 7B5 is a circuit for converting the data of the integrated circuit pattern, as stored in the magnetic disk driver 7B3, into image data in a two-dimensional map. The image data thus converted are stored in the image memory 7B8.

Moreover, the data converter 7B6, as electrically connected with the sensor 7A8, is a circuit for converting the data of the pattern on the photomask 1, as actually detected by the sensor 7A8, into image data in a two-dimensional map. The image data thus converted are stored in the image memory 7B7.

The comparator 7B9 is a circuit for comparing the image data stored in the image memories 7B7 and 7B8. The compared data are sent to the memory 8B10 until they are transmitted together with the positional coordinate data of the inspected region in the photomask 1 to the magnetic disk of the magnetic disk driver 7B3 or the CPU 7B1 via the data bus DB1. The memory 7B10 is electrically connected with the laser interferometer 7A3 of the inspection unit 7A to store the positional coordinate data transmitted from the laser interferometer 7A3.

The magnetic tape driver 7B11 is a device for reading out the magnetic tape which is stored with the design data of the integrated circuit pattern, for example. The data of the magnetic tape of the magnetic tape driver 7B11 are stored in the magnetic disk in the magnetic disk driver 7B3 through the input/output port 7B12.

Incidentally, with the data bus DB1, there is electrically connected through the I/O circuit a monitor or the like, by which the image of the inspection region can be visually inspected by the inspector.

The anomaly discrimination station 8 is an inspection mechanism for classifying the anomalous content by inspecting the appearance of the photomask 1, for example, and includes an inspection unit 8A and a data processing unit 8B. The anomalous content is classified, for example, into the cutout or residue of the shield pattern, the cutout or residue of the phase shifter pattern, an attached foreign obstacle, an error in the size or overlap of the shield pattern and the phase shifter pattern, or the phase difference error.

The inspection unit 8A is a component for executing the appearance inspection of the photomask 1, and includes an inspection stage 8A1, a stage drive mechanism 8A2, a coordinate measurement unit 8A3, an optical lens 8A4, a light source 8A5, a half mirror 8A6, an appearance monitor 8A7 and a control circuit 8A8.

The inspection stage 8A1 is a stage for placing the photomask 1 thereon. The stage drive mechanism 8A2 is a mechanism for setting the position of the photomask 1 by moving the inspection stage 8A1 in a plane. The coordinate measurement unit 8A3 is a component for detecting the position of the photomask 1 in plane coordinates.

The optical lens 8A4 is a lens for condensing the light, as emitted from the light source 8A5 and having come in through the half mirror 8A6, upon the photomask 1 and for focusing the light, as reflected from the photomask 1, upon the appearance monitor 8A7. The light, as emitted from the light source 8A5, is exemplified by a light having a wavelength as short as 325 nm (of He-Cd laser).

The control circuit 8A8 is a circuit for controlling the operations of the inspection unit 8A. For example, the control circuit 8A8 is enabled to set the planar position of the photomask 1 by driving the stage drive mechanism 8A2. At this time, the control circuit 8A8 calculates the movement of the inspection stage 8A1 by referring to the positional coordinate data of the photomask 1, as detected by the coordinate measurement unit 8A3.

The data processing unit 8B is a component for processing the data detected by the inspection unit 8A, and includes a CPU 8B1, a VDT 8B2, a communication I/O circuit 8B3 and memories 8B4 and 8B5. Incidentally, the CPU 8B1, the VDT 8B2, the memories 8B4 and 8B5, the appearance monitor 8A7 and the coordinate measurement unit 8A3 are electrically connected via a data bus DB2.

The CPU 8B1 is a main control unit for controlling the entire operations of the anomaly discrimination station 8. The communication I/O circuit 8B3 is a circuit for transferring data between the anomaly discrimination station 8, and the anomaly extraction station 7 and the phase difference measurement station 9. These individual stations 7 to 9 are electrically connected via the transmission cables by using the communication I/O circuit 8B3 as the data input/output circuit.

The memory 8B4 is a memory for storing data such as the data of a decision result. Incidentally, the decision result data are written with the coordinate data in which the anomaly content exists. On the other hand, the memory 8B5 is a memory for storing the coordinate data of the inspection region.

Specifically, in the anomaly discrimination station 8, on the basis of the data of an anomaly region, as transmitted from the anomaly extraction station 7, the pattern of the photomask 1 is inspected, and the anomalous content is decided and classified by the appearance monitor 8A7. After this, the decided result data are stored in the memory 8B4 together with the positional coordinate data of the inspection region, as transmitted from the coordinate measurement unit 8A3.

The phase difference measurement station 9 is exemplified by an inspection mechanism for inspecting the propriety of the phase difference of the light in the photomask 1, and includes an inspection unit 9A and a data processing unit 9b.

The inspection unit 9A is a component for executing the phase difference measurement of the photomask 1, and includes an inspection stage 9A1, a stage drive mechanism 9A2, a coordinate measurement unit 9A3, optical lenses 9A4 and 9A5, a light source 9A6, a monitor 9A7 and a control circuit 9A8.

The inspection stage 9A1 is a stage for placing the photomask 1 thereon. The stage drive mechanism 9A2 is a mechanism for setting the position of the photomask 1 by moving the inspection stage 9A1 in a plane. The coordinate measurement unit 9A3 is a component for detecting the position of the photomask 1 in planar coordinates. The optical lens 9A4 is a lens for condensing the light emitted from the light source 9A6 upon the photomask 1, whereas the optical lens 9A5 is a lens for condensing the light having passed through the photomask 1 upon the monitor 9A7. The light to be emitted from the light source 9A6 is exemplified by a light having a wavelength of the i-line (of 365 nm) as short as that of the exposure light.

The control circuit 9A8 is a circuit for controlling the operations of the inspection unit 9A. For example, the control circuit 9A8 is enabled to set the planar position of the photomask 1 by driving the stage drive mechanism 9A2. At this time, the control circuit 9A8 is enabled to calculate the movement of the inspection stage 9A1 by referring to the positional coordinate data of the photomask 1, as detected by the coordinate measurement unit 9A3.

The data processing unit 9B is a component for processing the data detected by the inspection unit 9A, and includes a CPU 9B1, a VDT 9B2, a memory 9B3, a communication I/O circuit 9B4 and a phase difference measurement unit 9B5. Incidentally, the CPU 9B1, the VDT 9B2, the memory 9B3, the communication I/O circuit 9B4 and the phase difference measurement unit 9B5 are electrically connected with one another via a data bus DB3.

The CPU 9B1 is a main control unit for controlling the entire operations of the phase difference measurement station 9. The memory 9B3 is stored with the coordinate data of the inspection region.

The communication I/O circuit 9B4 is a circuit for transferring data between the phase difference measurement station 9, and the anomaly extracting station 7 and the anomaly discrimination station 8. These individual stations 7 to 9 are electrically connected via the transmission cables by using the communication I/O circuit 9B4 as the data input/output circuit.

The phase difference measurement unit 9B5 is a measurement unit for measuring the phase difference error or the like of the light having passed through the photomask 1, on the basis of the pattern data observed in the monitor 9A7.

Specifically, in the phase difference measurement station 9, on the basis of the data of the anomalous region, as transmitted from the anomaly extraction station 7 or the anomaly discrimination station 8, the phase difference of the light having passed through the photomask 1 is measured, and the measured data are then stored in the memory 9B3 together with the positional coordinate data of the inspection region, as transmitted from the coordinate measurement unit 9A3.

In the individual stations 7 to 9, the individual CPU 7B1 to 9B1 can share the positional coordinate data on the photomask 1 in an interchangeable state. This makes it necessary to convert the coordinate systems among the inspection stage 7A1 of the anomaly extraction station 7, the inspection stage 8A1 of the anomaly discrimination station 8 and the inspection stage 9A1 of the phase difference measurement station 9. Here in the individual inspection stages 7A1 to 9A1, errors are in the orthogonality and linearity of the coordinate axes but can be reduced to convert the coordinate system by using a photomask having a standard lattice pattern on the photomask 1 to prepare a conversion map of the two-dimensional coordinate system.

In the individual stations 7 to 9, moreover, the individual CPUs 7B1, 8B1 and 9B1 are electrically connected with one another through the individual communication I/O circuits 7B4, 8B3 and 9B4 and the signal cables connected with the former, so that the individual coordinate data or the like can be transferred without any difficulty. These transfers can also be effected by carrying recording media such as floppy disks or optical disks together with the photomask 1. For this, the data have to be interchanged among the individual CPUs 7B1 to 9B1.

Moreover, the photomask 1 is enabled to process the individual inspection stages and to re-process, if instructed, the individual inspection stages by transferring its data together to the individual stations 7 to 9.

During the step of extracting the anomaly of a predetermined photomask 1, moreover, the anomaly decision can be performed upon a photomask 1 other than the predetermined photomask 1. This makes it possible to prevent the defect that the inspecting process is left undone in one inspecting apparatus in case the inspection is to be done in the inspecting apparatus. Thus, it is possible to improve the efficiency of inspecting the photomask 1.

Here will be described the method of inspecting the photomask 1 of Embodiment 1.

Figure 1:
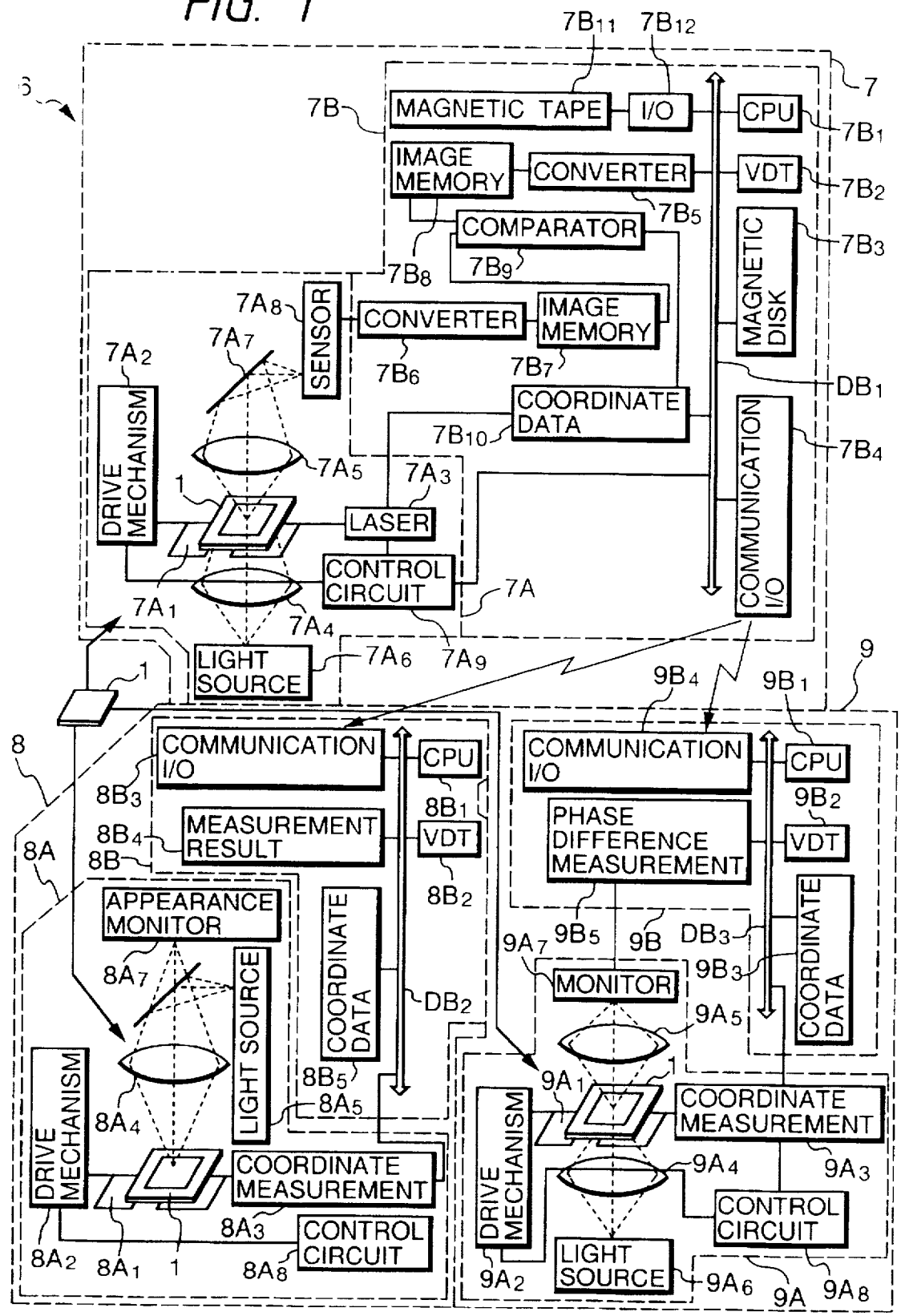
FIG. 1 is an explanatory diagram of a photomask inspecting apparatus according to one embodiment of the present invention.

First of all, the photomask 1 is conveyed to the anomaly extraction station 7 of the inspecting apparatus 6 of FIG. 1 and is placed on the planarly movable inspection stage 7A1 in the anomaly extraction station 7.

Subsequently, the anomaly detecting optical beam, as emitted from the light source 7A6, is applied to the back of the photomask 1 through the optical lens 7A4, and the light having passed through the photomask 1 is detected by the sensor 7A8 through the optical lens 7A5 and the reflector 7A7.

The anomaly detecting optical beam, as used herein, is exemplified by an argon laser having a wavelength of about 488 nm. Moreover, the image sensor is exemplified by a CCD array sensor.

This anomaly extraction station is required to enhance the detection rate and sensitivity of the pattern to the maximum. Here, the detection rate and sensitivity of the pattern per unit area are determined by the optical intensity of the light source 7A6 of the anomaly detecting light and the sensitivity of the sensor 7A8. Moreover, the detecting resolution can be improved by dividing the optical intensity of each pixel into a plurality. It is also advantageous to use the light source 7A6 for emitting a light having a short wavelength as the light source 7A6 for the anomaly detecting light, but the aforementioned light source is employed by considering the combination of the pixel number and pixel pitch of the image sensor.

In Embodiment 1, therefore, for detecting an anomaly, there is used an optical beam having a wavelength longer than that of the exposure light for transferring the pattern on the photomask 1 to the semiconductor wafer. In the phase difference inspection of the photomask, however, there is employed a light having the same wavelength as that of the exposure light for transferring the pattern to the semiconductor wafer, as described above.

The positional coordinate data on the photomask 1 are measured by the laser interferometer 7A3. Here, the positional coordinate data of the inspection stage 7A1 are measured at the unit of 0.01 µm, for example, by the so-called "laser interferometry" or the like, in which the laser beam is scanned in the two directions of X-axis and Y-axis. Moreover, the positional coordinate data on the photomask 1 and the image data, as detected by the sensor 7A8, are temporarily stored in the memory 7B10 and the image memory 7B7, respectively.

Here are compared either the image data detected by the sensor 7A8 and the aforementioned pattern data for forming the integrated circuit or the image data detected by the sensor 7A8 and the image data of a different region on the photomask 1. Moreover, the data of both the size of the region, in which the two data are different, and the simple classification due to the detected optical intensity difference are extracted together with the positional coordinates on the photomask 1. At the same time, the positional coordinate data in the portion of the difference and the data of the size and the simple classification are stored in the memory 7B10 or the magnetic disk driver 7B3. Thus, the anomalous portions on the photomask 1 are extracted.

Next, the photomask 1 is conveyed into the anomaly discrimination station 8 of the inspecting apparatus 6. Here, the main object is to observe the appearance of the photomask 1. The photomask 1 is placed at first on the planarly movable inspection stage 8A1, and its appearance is then observed by the inspection unit 8A.

This inspection unit 8A is exemplified by a confocal type laser microscope of high magnification. This optical system takes the resolution as its most important factor and may preferably have a shorter wavelength than the laser wavelength of the confocal type laser microscope. The content of the appearance anomaly can be easily decided by employing two kinds of method of applying a light for detecting the appearance anomaly to the back of the photomask 1 and method of applying the light to the surface of the photomask 1.

Here is aimed at the appearance observation, and the anomalous content can be more easily decided by adding a function to incline the inspection stage 8A1 after movement to a portion under consideration.

At the anomaly discrimination station 8, moreover, the visual field and the magnification can be easily varied so that a partial region of the aforementioned phase shifter pattern can be discriminated in its content even if it is gradually deformed in the vertical direction.

At this anomaly discriminating step, the portion, in which a difference occurs at the aforementioned anomaly extracting step, is observed as to the appearance of the photomask 1 in accordance of its positional coordinate data. The primary suitability discrimination is executed by classifying the anomalous content into the cutout of the shield pattern, the defect due to the residue of the shield pattern, the cutout of the phase shifter pattern, the defect due to the residue of the phase shifter pattern, the attached foreign substance, the size and overlap errors of the shield pattern and the phase shifter, and the phase difference error.

Here at the aforementioned discrimination, on the basis of the simply classified result by the anomaly extraction station 7, the data for an anomaly smaller than a predetermined size must not be transferred to the anomaly discrimination station 8 according to the quality level or the like of the mask. In other words, that region may be left unobserved by not taking it up as an anomaly. This makes it possible to improve the inspection efficiency at the anomaly discrimination station 8.

Next, the photomask 1 is conveyed into the phase difference measurement station 9. In this station 9, a secondary suitability is decided by measuring the phase difference of the light which is transmitted by the photomask 1. Here, it is possible to measure not only the phase difference error portion but also the phase difference of the phase shifter pattern being or after corrected.

First of all, the photomask 1 is placed on the planarly movable inspection stage 9A1. Here, the light to be applied to the photomask 1 is given the same wavelength as that of the light to be used for the exposure. If the photomask 1 is for exposing the i-line (having the wavelength of 365 nm), for example, the light is used for measuring the phase difference after the coherent light of the i-line has been prepared by transmitting the light, as emitted from a high-pressure mercury lamp or the like, through the filter.

Figure 10:
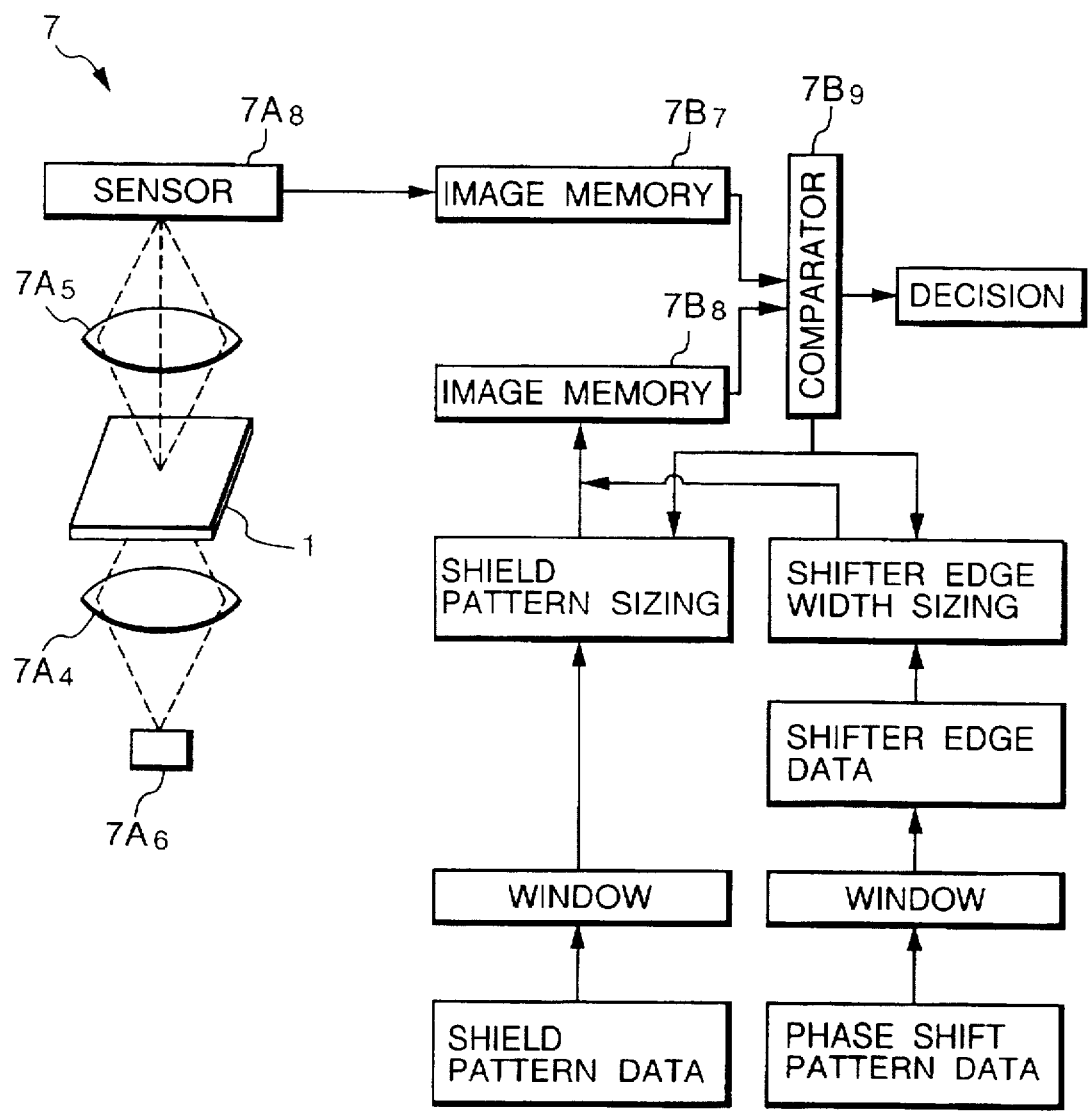
FIG. 10 is an explanatory diagram for explaining one example of a method of extracting an anomaly of the photomask.

One example of the method of extracting an anomaly of the photomask 1 of Embodiment 1 will be described in the following with reference to FIG. 10.

First of all, at the time of the anomaly extracting inspection of the photomask 1, the inspecting optical beam is applied to the back of the photomask 1, and the light having passed through the photomask 1 is detected by the sensor 7A8.

At this time, in Embodiment 1, the inspecting optical beam is individually applied to the edge portion of a normal shield pattern and the edge portion of a normal phase shifter pattern to prepare the image data of their individual transmitted lights.

Subsequently, those image data are individually compared with the shield pattern data for determining the optically transparent regions corresponding to the individual regions and the phase shifter pattern data for determining the regions to establish the phase difference of the transmitted lights. Specifically, the windows of one region in the shield pattern data and the phase shifter pattern data are opened to compare the pattern data in the region with the aforementioned image data. Incidentally, as to the phase shifter pattern data, the data of the shifter edge are further extracted from the insides of the windows.

On the basis of the compared values, moreover, the bias values of the widths of the shield pattern in the shield pattern data on the design data and the in the shield pattern in the phase shifter pattern data and the bias value of the width of the boundary region of the phase shifter pattern are so changed that the shield pattern and the phase shifter pattern on the data, as prepared from the design data, may be identical to the pattern, as prepared by the actual measurements.

After this, at the photomask 1 excepting the regions in which the normal shield pattern and the phase shifter pattern are formed, the shield pattern data and the shifter pattern data are converted into the bit map pattern by the changed bias values. Then, the shield pattern data and phase shifter pattern data thus converted are synthesized to prepare a bit map.

The anomaly portions on the photomask 1 are extracted by comparing and collating the bit map thus obtained with the other regions of the photomask 1. By this method, it is possible to inspect the appearance of the mask in which the phase shifter pattern and the shield pattern are mixed.

Figure 11:
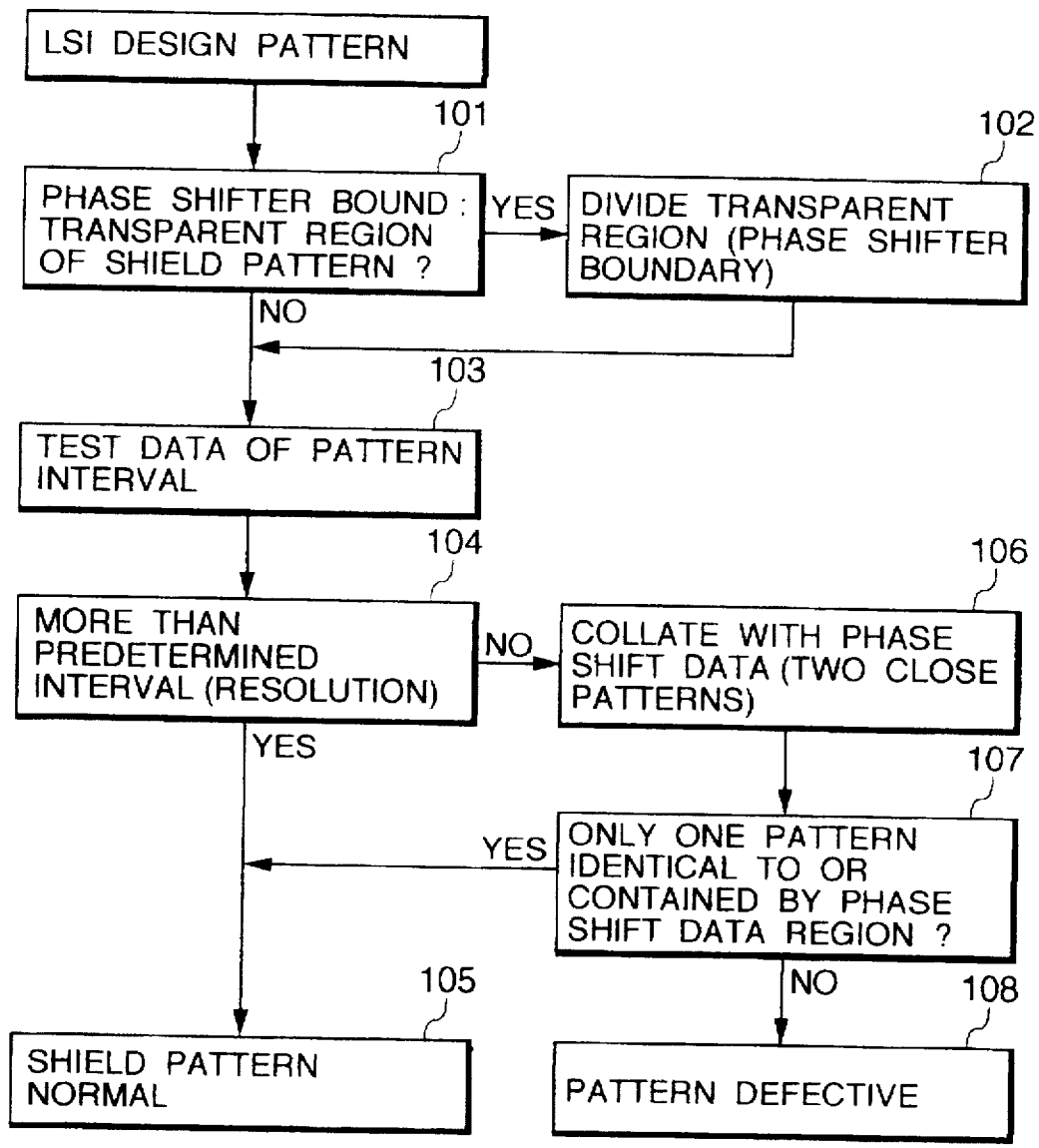
FIG. 11 is an explanatory diagram for explaining the principle of a method of measuring a phase difference in the photomask.

One example of the method of discriminating an anomaly of the photomask 1 of Embodiment 1 will be described in the following with reference to FIG. 11. Here will be separately described the cases in which the transparent regions of the photomask 1 have and does not have the edge portions of the phase shifter pattern.

The process will be executed according to the following steps, for example, in the first case in which the edge portions of the phase shifter pattern are in the transparent regions.

First of all, the pattern data on the LSI design data for forming a transparent region on the photomask 1 is inspected (at Step 101 of FIG. 11) upon whether or not the edge portion of the phase shifter pattern is present in the transparent region.

Subsequently, if the edge portion of the phase shifter pattern is present in the transparent region, the pattern forming the transparent region is divided (at Step 102) at the minimum address unit to prepare two data by using the edge portion of the phase shifter pattern as a boundary region.

After this, it is decided for the pattern data thus prepared whether or not the individual patterns forming the transparent region has a predetermined or more interval. This interval is necessary for achieving a sufficient resolution (at Steps 103 and 104).

If more than the predetermined interval, it is decided (at Step 105) that the pattern is normal. If less than the predetermined interval, on the other hand, the phase shifter pattern data are referred to (at Step 106) to inspect the data upon whether the phase shifter pattern is arranged in alignment with or contained in either of the patterns of the transparent regions arranged at that interval. This inspection is performed for all the regions of the photomask 1 (at Step 107).

Here, if the phase shifter pattern is not arranged in such manner, it is decided (at Step 108) that the pattern is defective. If the phase shifter pattern is arranged as such, on the other hand, it is decided (at Step 105) that the pattern is normal.

Secondly, the following process is followed if the edge portion of the phase shifter pattern is not present in the transparent region of the photomask 1. Here, the same portions as the aforementioned ones will also be described by using a portion of FIG. 11.

First of all, the adjoining interval of the pattern forming the transparent region on the photomask 1 is inspected (at Step 103), and it is decided (at Step 104) whether or not the interval is more than the aforementioned predetermined value.

In this instance, if the interval exceeds the predetermined value, it is decided (at Step 105) that the pattern is normal. If the interval is below the predetermined value, on the other hand, the data of the phase shifter pattern are referred to (at Step 106), to inspect the data upon whether the phase shifter pattern is arranged in alignment with or contained in either of the patterns of the transparent regions arranged at that interval (at Step 107).

Here, if the phase shifter pattern is not arranged in such manner, it is decided (at Step 108) that the pattern is defective. If the phase shifter pattern is arranged as such, it is decided (at Step 105) that the pattern is normal.

Here will be described the phase difference measurement of the light which is transmitted by the photomask 1.

Figure 12:
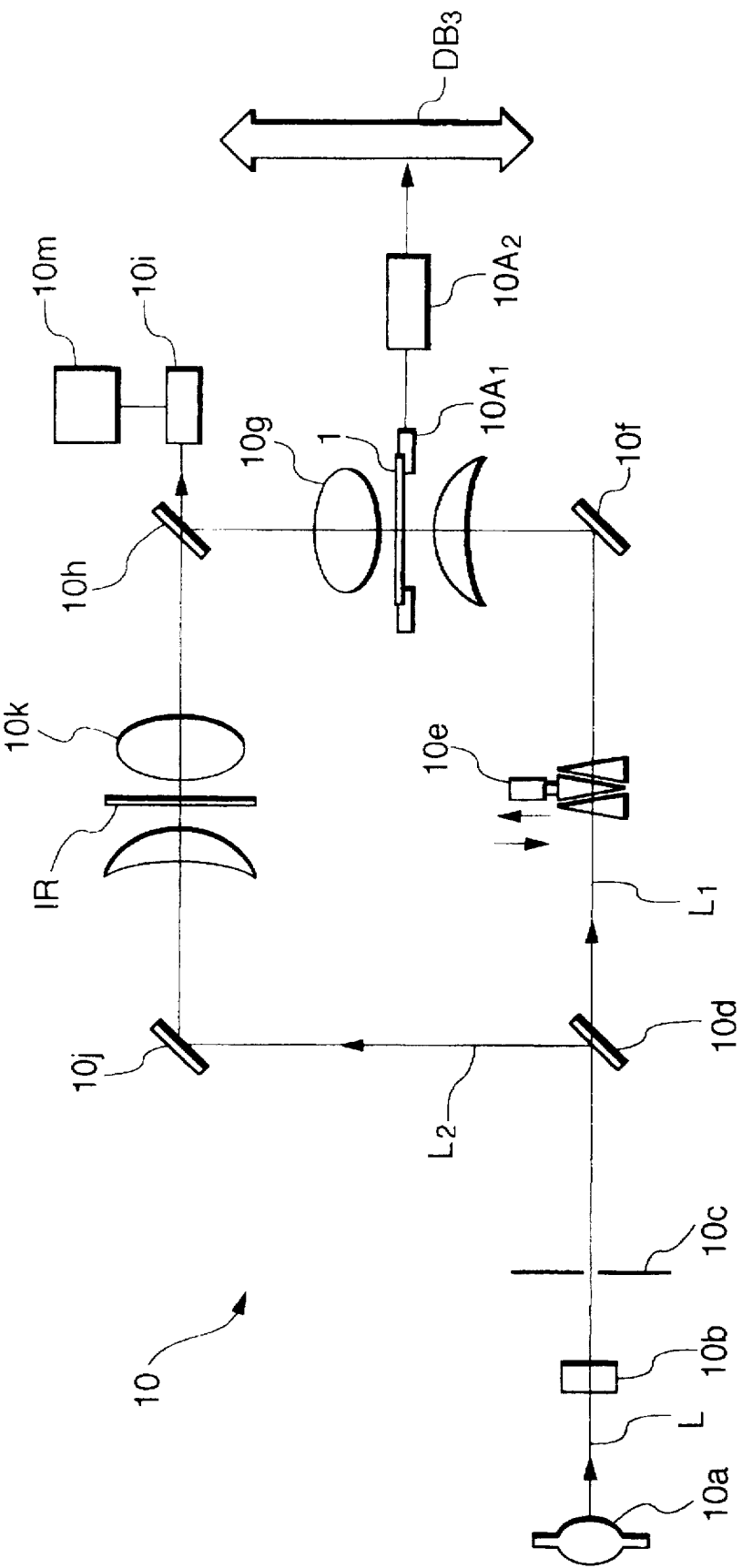
FIG. 12 is an explanatory diagram for explaining one example of an anomaly discrimination of the photomask.

FIG. 12 is an explanatory diagram of an optical system for measuring the phase difference highly accurately between the light having passed through the phase shifter pattern formed over the photomask 1 and the light having passed through the region having no phase shifter pattern.

The phase shifter pattern is exemplified by the grooves which are formed by digging a transparent film or mask substrate made of $SiO_2$ or the like and deposited over the mask substrate by the SOG method or the like. Here will be described the phase difference measurement of the photomask 1 which has a phase shifter pattern by digging the mask substrate, for example.

This optical inspection apparatus 10 uses the optical interferometry. A light L, as emitted from a light source 10a such as a high-pressure mercury lamp, is applied through a filter 10b and an aperture 10c to a beam splitter 10d, through which it is separated into a projecting exposure light L1 and a light L2 having an equal wavelength.

One light L1 is transmitted through a phase corrector 10e and a reflecting mirror 10f by the exposure region of the transparent photomask 1 so that the transmitted light is applied through an optical lens 10g and a half mirror 10h to a detector 10i.

On the other hand, the other light L2 is transmitted through a beam splitter 10j by a reference substrate 1R which is made of synthesized quartz having a thickness and a refractive index substantially equal to those of the photomask 1 so that the transmitted light is applied through an optical lens 10k and the half mirror 10h to the detector 10i.

At this time, the phase collector 10e is adjusted to synthesize again the individual lights transmitted by the photomask 1 and the reference substrate 1R so that the lights may interfere each other to establish no phase difference between the photomask 1 and the reference substrate 1R. Moreover, the synthesized light is detected by the detector 10i and is stored in a memory 10m. Incidentally: reference characters 10A1 in FIG. 12 designate an inspection stage; characters 10A2 a stage drive mechanism; and characters DB3 a data bus. These components correspond to those 9A1, 9A2 and DB3 of FIG. 1.

Figure 13:
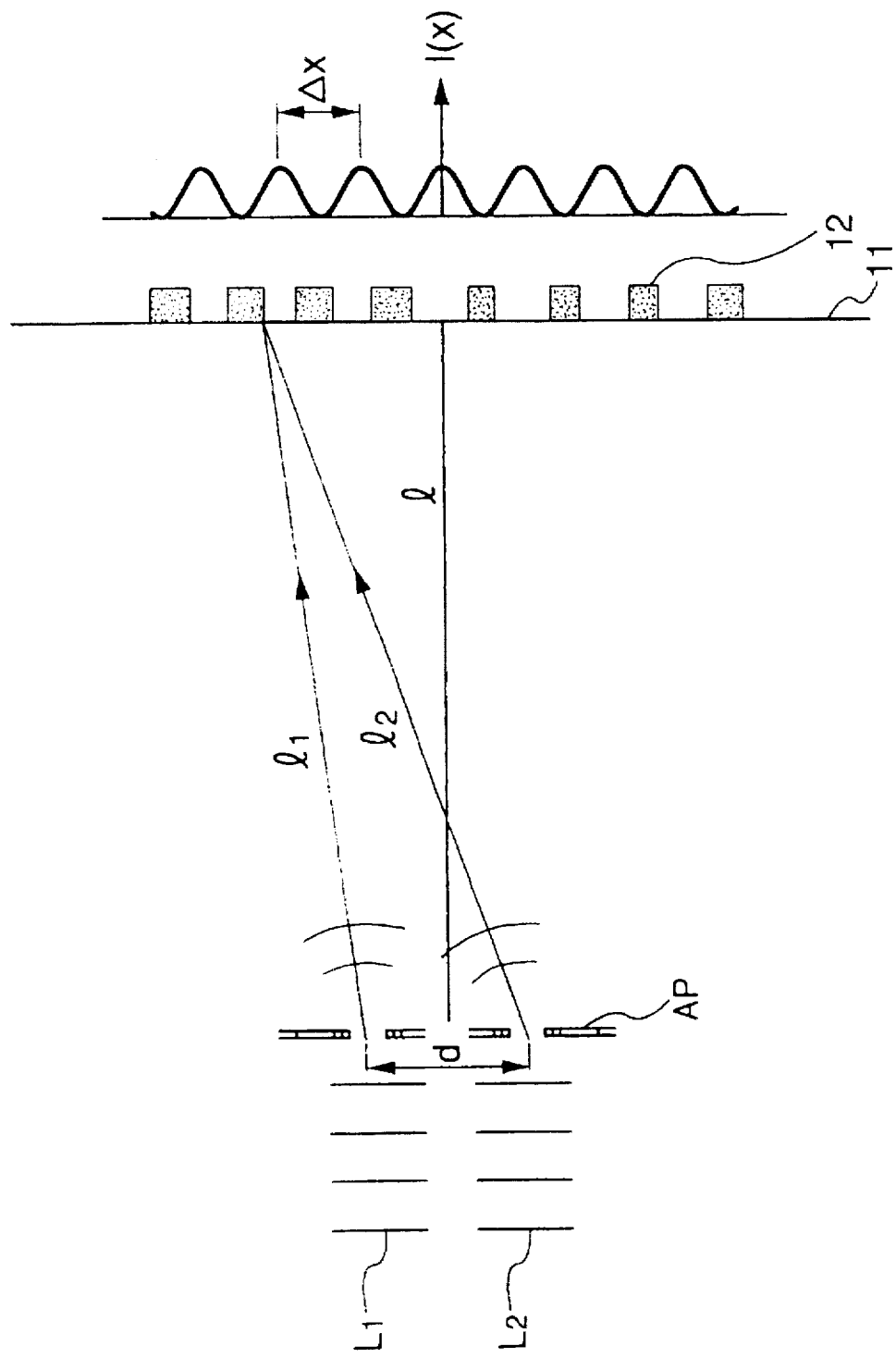
FIG. 13 is an explaining diagram of the principle of a method of measuring the phase difference in the photomask.

FIG. 13 is an explanatory diagram for explaining the principle of the method of measuring the phase difference of the photomask 1 in the optical inspection apparatus 10. FIG. 13 illustrates the interference of the case in which the light L1 having passed through the photomask 1 and the light L2 having passed through the reference substrate 1R are synthesized again.

The two lights L1 and L2 have a common wavelength $\lambda$ and are synthesized at a spacing of the difference d of an alignment position AP to form an interference fringes 12 on a screen 11. In this case, the optical intensity on the screen 11 is determined in the following manner. Specifically, if the light L1 has a wave number K and a phase $\phi 1$ whereas the light L2 has a wave number K and a phase $\phi 2$, the electric field intensity by the light L1 is expressed by $u1 = A\exp[-i(K1_1-\phi 1)]$ whereas the electric field intensity by the light L2 is expressed by $u2 = B\exp[-i(K1_2-\phi 2)]$.

Hence, those synthesized light has an intensity I(x), as expressed by $I(x) = [u1+u2]^2 = A^2 + B^2 + 2AB\cos[Kxd/1+\phi 2-\phi 1]$. Incidentally, in this equation, $1_1 - 1_2 = kxd/1$.

Hence, if the change in the optical path 1 is designated by $\Delta l$ and if the phase difference is expressed by $\Delta\phi = \phi 2 - \phi 1$, $\Delta\phi = 2\pi d/\lambda \Delta l$ so that the phase difference $\Delta\phi$ changes with the change $\Delta l$ of the optical path. From this, it is possible to determine the relative phase difference between the photomask 1 and the reference substrate 1R. This optical inspection apparatus 10 is disclosed in detail in Japanese Patent Application No. 247100/1990.

The optical inspection apparatus 10 of FIG. 12, as used in Embodiment 1, is equipped over the screen 11 with the detector 10i made of an image sensor such as a CCD array sensor. The phase of the phase collector 10e is finely shifted to determine the difference the regions with and without the adjoining phase shifter patterns over the photomask 1 so that the phase difference can be accurately detected.

Moreover, the intensity changes of the interference lights, as corresponding to the regions with and without the phase shifter pattern, can be stored in the memory 10m to widen the application range. As a result, it is possible to measure the phase difference between the transmitted light of the photomask 1 and the reference light or the transmitted light of the reference substrate 1R.

Incidentally, the method of determining the phase difference data at the time of forming the phase shifting grooves and the method of determining the etching condition for detecting the etching final point can be exemplified not only by the aforementioned optical interferometry but also by the various methods such as the laser interferometry, the optical reflection method, the spectro-chemical analysis or the infrared absorption.

As described hereinbefore, according to Embodiment 1, one step of inspecting the photomask 1 is divided into a plurality of inspection steps so that even the photomask 1 having a fine pattern such as the photomask 1 having a phase shifter pattern to establish the phase difference in the transmitted light can be pattern-inspected highly efficiently and accurately in respect of the anomaly extraction or the decision propriety, especially the presence or absence of the phase difference error.

Figure 14:
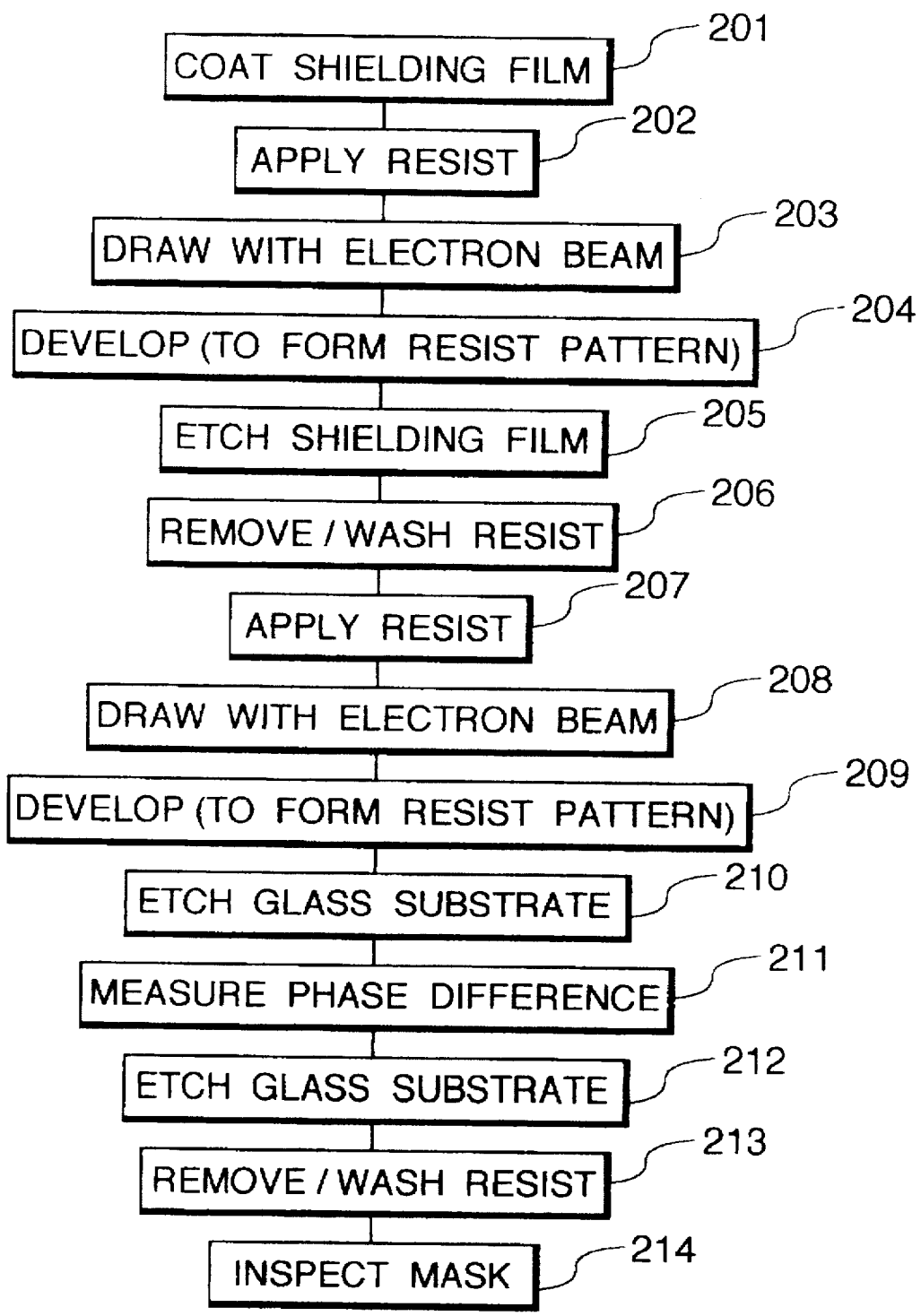
FIG. 14 is a flow chart of manufacturing the photomask.

Next, the process for manufacturing such photomask 1 will be described along the routine of FIG. 14 with reference to FIGS. 15 to 23. The photomask 1 of Embodiment 1 is used to transfer a predetermined integrated circuit pattern to a semiconductor wafer in a photolithography for manufacturing a semiconductor integrated circuit device, for example, and is called the "reticule" in which an original of the integrated circuit pattern five times as large as the actual size is formed.

Figure 15:
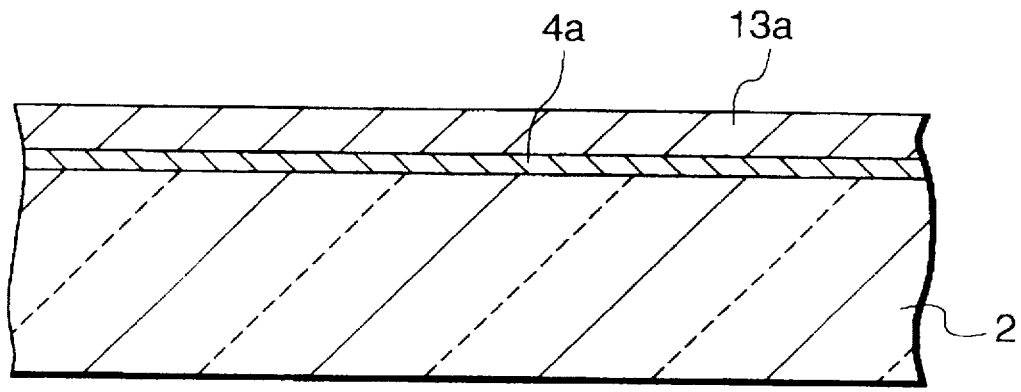
FIG. 15 is a section of an essential portion in a step of manufacturing the photomask.

First of all, as shown in FIG. 15, a shielding film 4a made of chromium (Cr), for example, is deposited (at Step 201) by the sputtering method or the like all over the principal face of the mask substrate 2 which is made of transparent synthetic quartz having a refractive index of about 1.47. A electron beam sensitive type resist film 13a is applied (at Step 202) to the shielding film 4a by the spin application method or the like.

The electron beam sensitive type resist film 13a, as used here, is exemplified by a positive type resist film from which an exposed portion is removed by a developing liquid, to reduce the exposure area. Incidentally, the resist film can also be exemplified by a negative type resist film from which an unexposed portion is removed by a developing liquid. In addition, the resist film can also be exemplified not only by the electron beam sensitive resist film which can be finely worked but also by such a resist film as is sensitive to a light such as an ultraviolet ray.

Subsequently, the mask substrate 2 is conveyed into the electron beam drawing device. This electron beam drawing device shapes the electron beam into a predetermined shape on the basis of the pattern data in the memory, and this shaped electron beam is applied (at Step 203) to a predetermined position of the resist film 13a.

The pattern data, as used here, are various ones such as the sizes, shapes and positional coordinates of the individual drawings of the integrated circuit pattern and correspond to the transparent regions or shielding regions over the mask substrate 2. Moreover, the positive type resist and the negative type resist are ordinarily selected to reduce the area to be irradiated with the electron beam.

At this exposure treatment, moreover, the peripheral regions of the mask substrate 2 are orthogonally exposed to not only the aforementioned pattern but also the patterns for the two alignment marks 3a to be used for forming the phase shifter pattern, as shown in FIG. 2. This pattern is exemplified by a cross mark of about 100 μm, for example.

The peripheral portions of the transfer region of the mask substrate 2 are exposed to the alignment marks 3b for aligning the mask substrate 2 and the semiconductor wafer, in addition to those alignment marks 3a. These marks are designated to correspond to the kind of the reducing projection exposure apparatus.

After this, a development is executed (at Step 204). Here, the exposed region is removed, if the resist film is of the positive type, and the unexposed region is removed if the resist film is of the negative type. For forming the pattern of contact holes, for example, the exposed area can be reduced by using the positive type resist.

Figure 16:
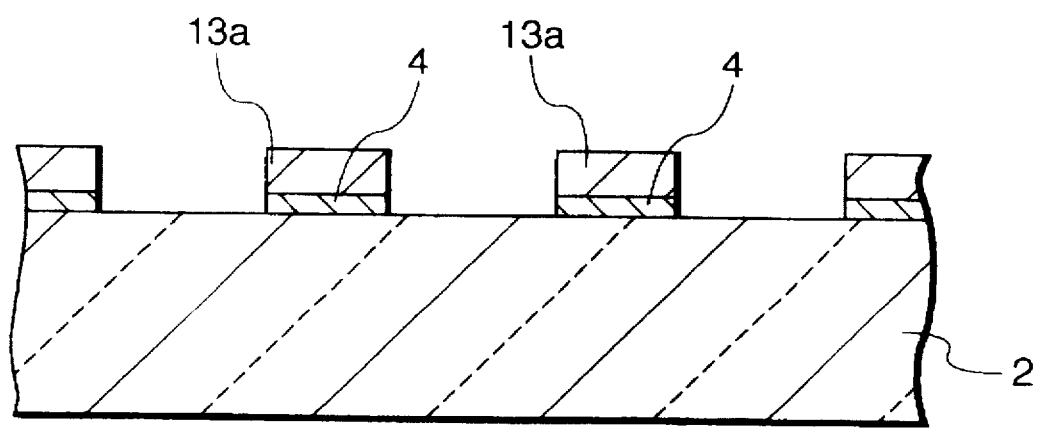
FIG. 16 is a section of an essential portion at a photomask manufacturing step subsequent to FIG. 15.

After this development, the exposed shielding film 4a is etched off from the resist film 13a left over the mask substrate 2, to form the shield pattern 4 over the mask substrate 2, as shown in FIG. 16. This etching treatment is of the wet type (at Step 205) using ammonium cerium (IV) nitrate.

Figure 17:
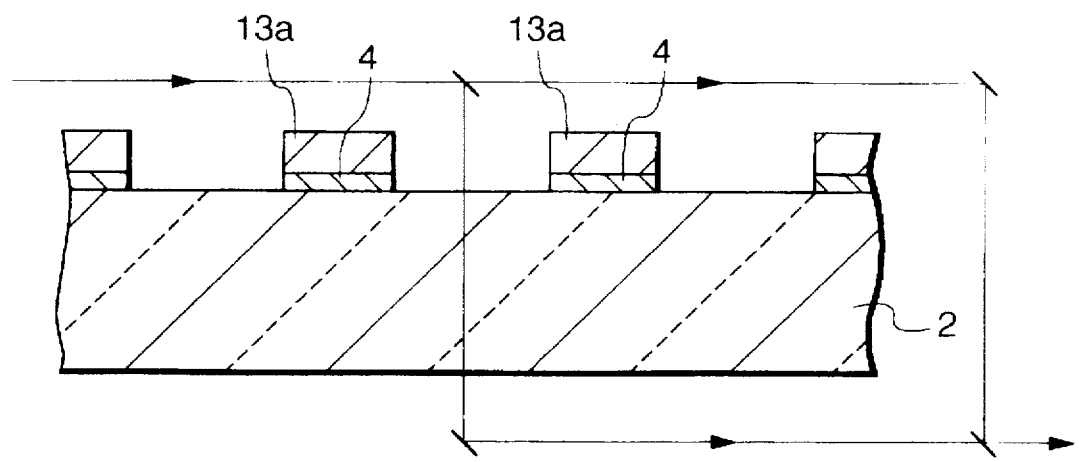
FIG. 17 is a section of an essential portion at a photomask manufacturing step subsequent to FIG. 16.

Subsequently, the resist film, as left over the mask substrate 2, is removed, and the mask substrate 2 is washed (at Step 206). Then, the appearance of the shielding film pattern 4 is inspected, as shown in FIG. 17. Specifically, the appearance of the mask substrate 2 is inspected by detecting the transmitted light or reflected light of the mask substrate 2 and by compare the normal mask pattern having the shield pattern with the pattern of the same shape or the pattern data prepared from the data for providing the basis of drawing of the electron beam.

If a defect such as the residue of the shield pattern or the cutout of the shielding film pattern 4 in the transparent region is discovered by that appearance inspection, the following defect correction is performed.

First of all, if the residue of the shield pattern material is discovered in the transparent region, it is removed by the laser irradiation or the like. Specifically, the laser beam is applied to remove the residue.

If the shield pattern 4 is cut out, the focused ion beam is applied to the cutout region of the shield pattern 4 while feeding an organic gas to that cutout region, to form a shielding film made of carbon in that cutout region. Thus, it is possible to form the mask pattern which has an effectively complete shield pattern 4.

After this, the thickness of the mask substrate 2 is measured and stored by the optical inspecting apparatus, as shown in FIG. 12. The data at this time are used as those for specifying the etching condition such as the etching ending point at the time for forming the grooves for the phase shifter pattern.

In this case, as to the mask substrate 2 before the etching step for forming the phase shifter pattern grooves, the phase corrector 10e (as shown in FIG. 12) is adjusted with reference to the reference substrate 1R (as shown in FIG. 12) thereby to establish no phase difference of the transmitted light.

Figure 18:
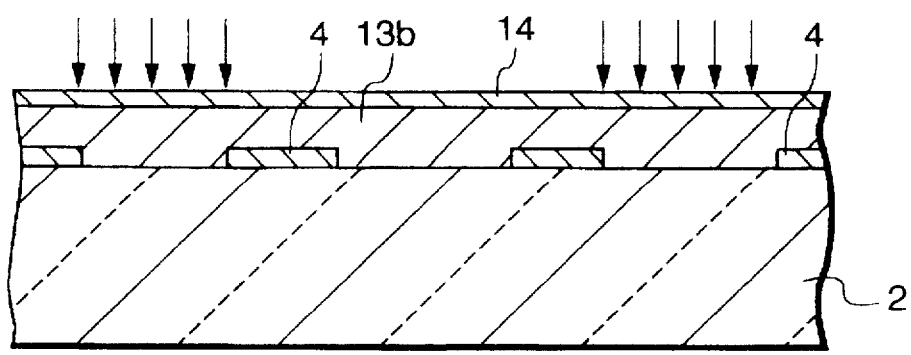
FIG. 18 is a section of an essential portion at a photomask manufacturing step subsequent to FIG. 17.

Next, as shown in FIG. 18, a resist film 13b for the etching mask is applied (at Step 207) by the spin application method or the like to the mask substrate 2 having the shield pattern 4. The resist film 13b is exemplified by the electron beam sensitive resist film of positive type chemical magnification. As a result, a fine working can be achieved. Incidentally, the resist film 13b can be exemplified by various resist films like the aforementioned resist film 13a.

Subsequently, an electrically conductive polymer film 14 is applied as a reflection preventing film to the resist film 13b, and an electron beam is then applied to a predetermined position of the resist film 13b by using the electron beam drawing device. Specifically, in the electron beam drawing device, the pattern of the alignment marks 3a for mask alignment over the mask substrate 2 is detected to align the coordinates of the shield pattern formed over the mask substrate 2 and the mask having the pattern to be formed on the resist film 13b, so that the electron beam is applied (at Step 208) to a predetermined position in the resist film 13b by using the predetermined pattern of the mask.

Here, the mask pattern to be irradiated with the electron beam corresponds to the region ($\phi=\pi$ region) for forming the phase shifter pattern to be formed over the mask substrate 2. The drawing accuracy of the electron beam drawing device can be set to less than 0.1 μm, for example, as the alignment of the pattern so that this system can be applied, while retaining a high working accuracy, to the manufacture of the photomask 1 (or reticule) for the exposure system having a reduction ratio of 1/5.

Figure 19:
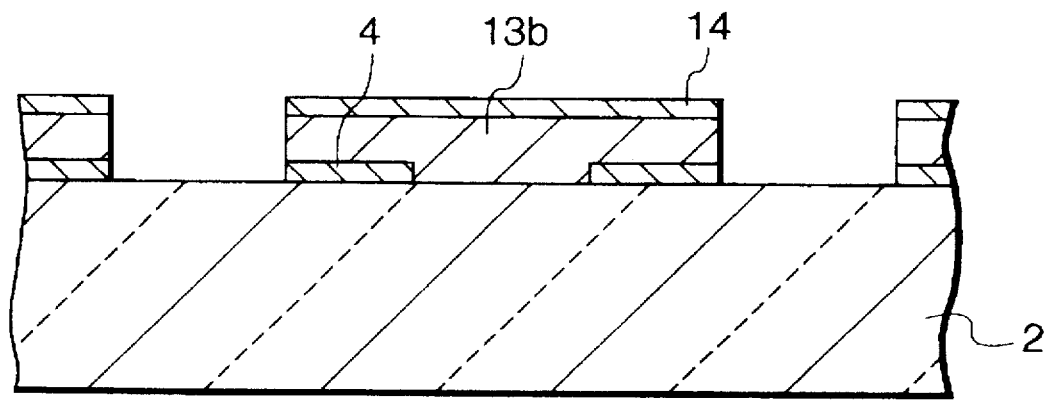
FIG. 19 is a section of an essential portion at a photomask manufacturing step subsequent to FIG. 18.
Figure 20:
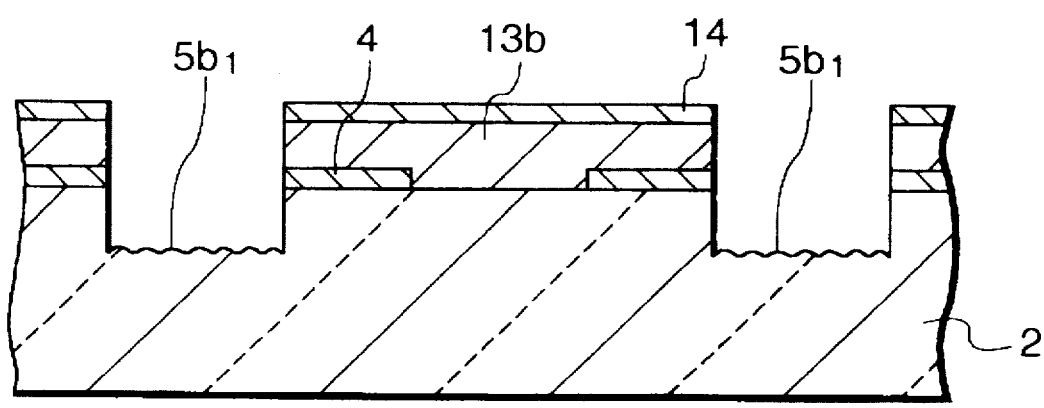
FIG. 20 is a section of an essential portion at a photomask manufacturing step subsequent to FIG. 19.

After this, as shown in FIG. 19, a development is executed (at Step 209) to form the pattern of the resist film 13b. After this, the resist film 13b and the underlying shield pattern 4 are used as the etching masks to subject the mask substrate 2 to the first etching step (Step 210) in a manner to satisfy the later-described conditions, as shown in FIG. 20, to form grooves 5b1 for forming the phase shifter pattern having a depth.

In this case, the thickness of the grooves for the final phase shifter pattern after the later-described second etching, that is, the depth D of the grooves for a target phase shifter pattern is so set as to satisfy a relation of $D=\lambda/2(n-1)$ for the wavelength $\lambda$ of the exposure light and the refractive index n of the material for the mask substrate.

By finally forming the grooves for the phase shifter pattern, as satisfying that relation, the transmitted light for the exposure in the regions of the grooves for the phase shifter pattern takes an effectively reversed phase with respect to the region of the mask substrate 2, as not etched, so that the condition for shifting the phase of the light is satisfied.

The first etching treatment is accurately executed to satisfy the aforementioned relation. Specifically, by adopting the plasma etching and using the resist film 13b and the shield pattern 4 as the etching masks, for example, the exposed region of the mask substrate 2 is etched off by setting the etching time to about 90% of the etching time necessary for etching a predetermined depth. As a result, it is possible to form the grooves 5b1 having a depth of about 90% as large as that of the groove 5b (as shown in FIG. 4) for the phase shifter pattern.

The plasma etching treatment is an etching technique capable of finely working and uses a plasma etching device of parallel-plate type. The etching gas is exemplified by a reactive gas such as carbon tetrafluoride ($CF_4$) or trifluoromethane ($CF_3$). Incidentally, the first etching step can be exemplified by not only the plasma etching method but also a variety of dry etching methods capable of finely working. By thus effecting the first etching step by the plasma etching method, it is possible to form the fine and deep grooves 5b1 for the phase shifter pattern for a short time period.

Figure 21:
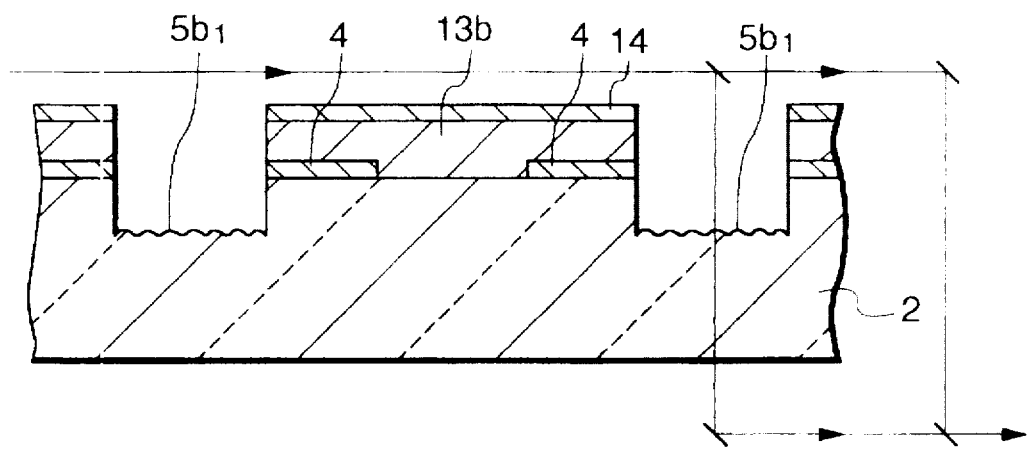
FIG. 21 is a section of an essential portion at a photomask manufacturing step subsequent to FIG. 20.

Incidentally, the reproducibility of the plasma etching is not sufficient for the target phase difference error. In the present embodiment, therefore, when the grooves for the phase shifter pattern are formed in the mask substrate 2, the grooves 5b1 are formed by setting the plasma etching time so that about 90% of the predetermined depth may be achieved. After this, the phase difference of the light to pass through the photomask 1 is optically measured, as shown in FIG. 21, so that the subsequent digging extent is determined from the errors between the measured phase difference and the phase difference to be achieved for the satisfactory grooves.

Here, the depth of the grooves 5b1 for the phase shift pattern is measured (at Step 211) by using the optical inspecting apparatus 10, as shown in FIG. 12. Specifically, the remaining etching depth for shifting the phase difference of the transmitted light by a half wavelength is determined like before by detecting the phase difference from the phase shifter pattern grooves 5b1 in the mask substrate 2 with reference to the reference substrate 1R.

Here, the substantial etching extend of the mask substrate 2, i.e., the etching extend for allowing the phase shifter pattern grooves 5b (as shown in FIG. 4) to function can be determined with reference to the aforementioned memory value in connection with the minute shift of the phase of the phase corrector 10e and the corresponding intensity change of the synthesized light. As a result, it is possible to determine the remaining etching depth at the second etching time for forming the grooves 5b (as shown in FIG. 4) for the phase shifter pattern.

However, this phase difference measuring method should not be limited to the method using the reference substrate but can be modified in various manners. For example, the phase difference of the transmitted light may be measured at the etched region and the unetched region of the photomask 1 to be measured.

Specifically, prior to the plasma etching treatment, a mask is formed at first over a portion of the mask substrate 2. The mask is removed at the subsequent phase difference measuring time. The inspecting light is applied to both the unetched region, as formed by removing the mask, and the region having the grooves 5b1, and the phase difference between the lights having passed through the two regions is measured.

In either event, an error from the target etching depth is determined by the phase difference measurement after the aforementioned etching treatment.

Figure 22:
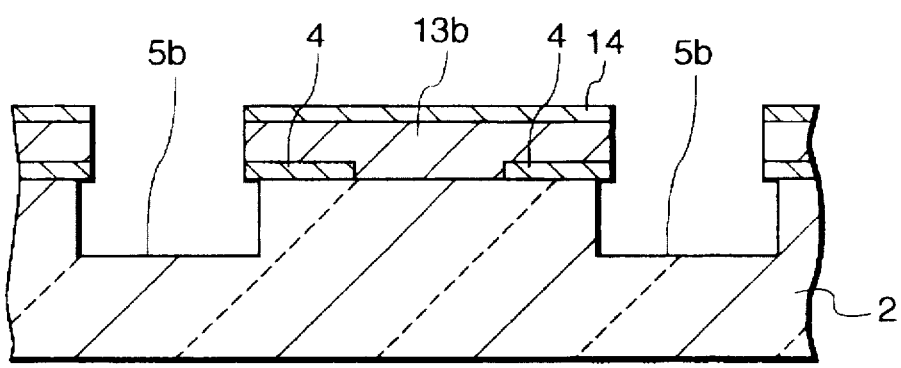
FIG. 22 is a section of an essential portion at a photomask manufacturing step subsequent to FIG. 21.

Subsequently, the mask substrate 2 is subjected to the second etching treatment (at Step 212), as shown in FIG. 22. At this time, a wet etching treatment is effected by setting the time to attain the predetermined depth of the grooves 5b. The etching liquid at this time is exemplified by an aqueous solution of hydrogen fluoride (HF). Moreover, the etching rate at this time is to cut out the surface of the grooves 5b1 by about 100 angstroms.

Thus, in Embodiment 1, the surfaces of the phase shifter pattern grooves 5b1, as formed by the plasma etching treatment, are removed by the wet etching treatment so that they can be smoothed to eliminate or reduce the minute foreign substance therefrom.

If the aforementioned first etching treatment is exemplified by the dry etching method, the effect obtainable is that the deep and fine grooves 5b1 for the phase shifter pattern can be formed within a short time period. However, there is left unsolved a problem that the bottoms of the phase shifter pattern grooves 5b1 are so finely roughed that they fail to match the phase shifter pattern grooves 5b. This is the problem that cannot be avoided in the case of manufacturing the photomask of the prior art having the grooved phase shifter pattern.

In Embodiment 1, on the contrary, the bottoms of the phase shifter pattern grooves 5b1 can be cleared of the fine roughnesses to have smooth surfaces by effecting the second etching treatment by the wet etching method.

Thus, in Embodiment 1, for forming the grooves for the phase shifter pattern, the merits of the dry etching treatment and the wet etching treatment are utilized in combination so that the phase shifter pattern grooves having smooth and fine surfaces can be easily formed for a short time period. As a result, it is possible to substantially reduce the manufacture dispersion between the photomasks 1 and to set the phase difference of the lights transmitted by the masks to a desired value.

As shown in FIG. 22, moreover, after the second etching treatment, the projections of the shield pattern 4 are formed in a manner to overhang over the surfaces of the phase shifter pattern grooves 5b. These overhanging projections are formed as a result that all the surfaces of the phase shifter pattern grooves 5b are isotropically etched to remove the mask substrate portions below the shield pattern 4 because the wet etching method is adopted at the second etching treatment.

The projections of the shield pattern 4 is given a length less than $\lambda/5$ for the wavelength $\lambda$ of the exposure light so that the exposure light, as scattered at the side faces of the phase shifter pattern grooves 5b, can be prevented from being transferred to the surfaces of the semiconductor wafer or the like at the time of projection exposure using that photomask 1. Incidentally, the depth of the aforementioned phase shifter pattern grooves 5b1 is set, when these grooves 5b1 are to be formed, to about 90% of the predetermined depth. This depth is regulated on the basis of the condition that the length of the projections of the shield pattern 4 should be less than $\lambda/5$.

Figure 23:
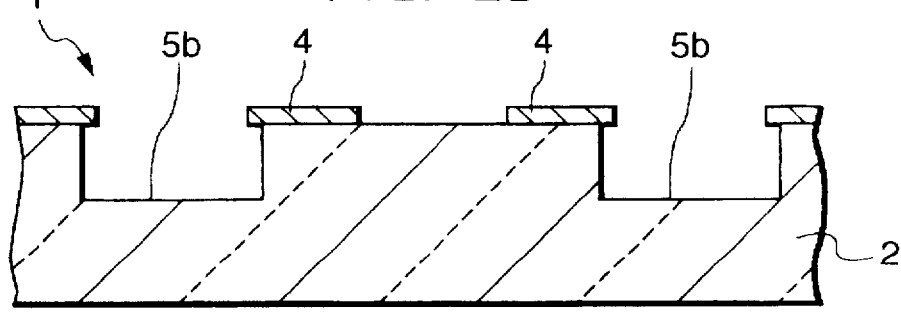
FIG. 23 is a section of an essential portion at a photomask manufacturing step subsequent to FIG. 22.

After this, the electrically conductive polymer film 14 and the resist film 13b now unnecessary are removed, and the mask substrate 2 is washed (at Step 213). After this, the process for forming the pattern over the photomask 1 is ended, as shown in FIG. 23.

After this, the appearance of the phase shifter pattern, as formed of the phase shifter pattern grooves 5b, is inspected (at Step 214) by the aforementioned method of the photomask 1. This photomask 1 is completed by correcting the pattern, if necessary.

An example of the reducing projection exposure apparatus to be employed in the exposure method using the photomask 1 of Embodiment 1 will be described in the following with reference to FIG. 24.

In a reducing projection exposure system 15 of Embodiment 1: the coherency is 0.3, for example; the projecting optical lens has a numerical aperture NA of 0.5; and the reducing projection exposure has a reduction ratio M of 1/5.

The optical system of the reducing projection exposure system 15 is arranged on an exposure light joining an exposure light source 15a and a sample state 15b, and includes mirrors 15c1 and 15c2, a shutter 15d, a fly-eye lens 15e, a condenser lens 15f and a reducing projection optical lens system 15g.

The photomask 1 is so interposed between the condenser lens 15f and the reducing projection optical lens system 15g of the reducing projection exposure system 15 that the photomask 1 and a semiconductor wafer W are aligned b an alignment optical system 15h.

The exposure light source 15a is exemplified by a high-pressure mercury lamp for emitting the light L of the i-line. A light LP, as emitted from the exposure light source 15a, is applied to the principal surface of the semiconductor wafer W on the sample stage 15b through the mirrors 15c1 and 15c2, the condenser lens 15f, the photomask 1 and the reducing projection optical lens 15g. The semiconductor wafer W is made of a silicon (Si) single crystal, for example, and a photosensitive photoresist film is applied to the principal surface of the semiconductor wafer W by the spin application method or the like.

This exposure method may be exemplified by the step & scan exposure method. This step & scan exposure method is a kind of reducing projection exposure and has an object to achieve an effective exposure region by using the common reducing projection lens.

Figure 24:
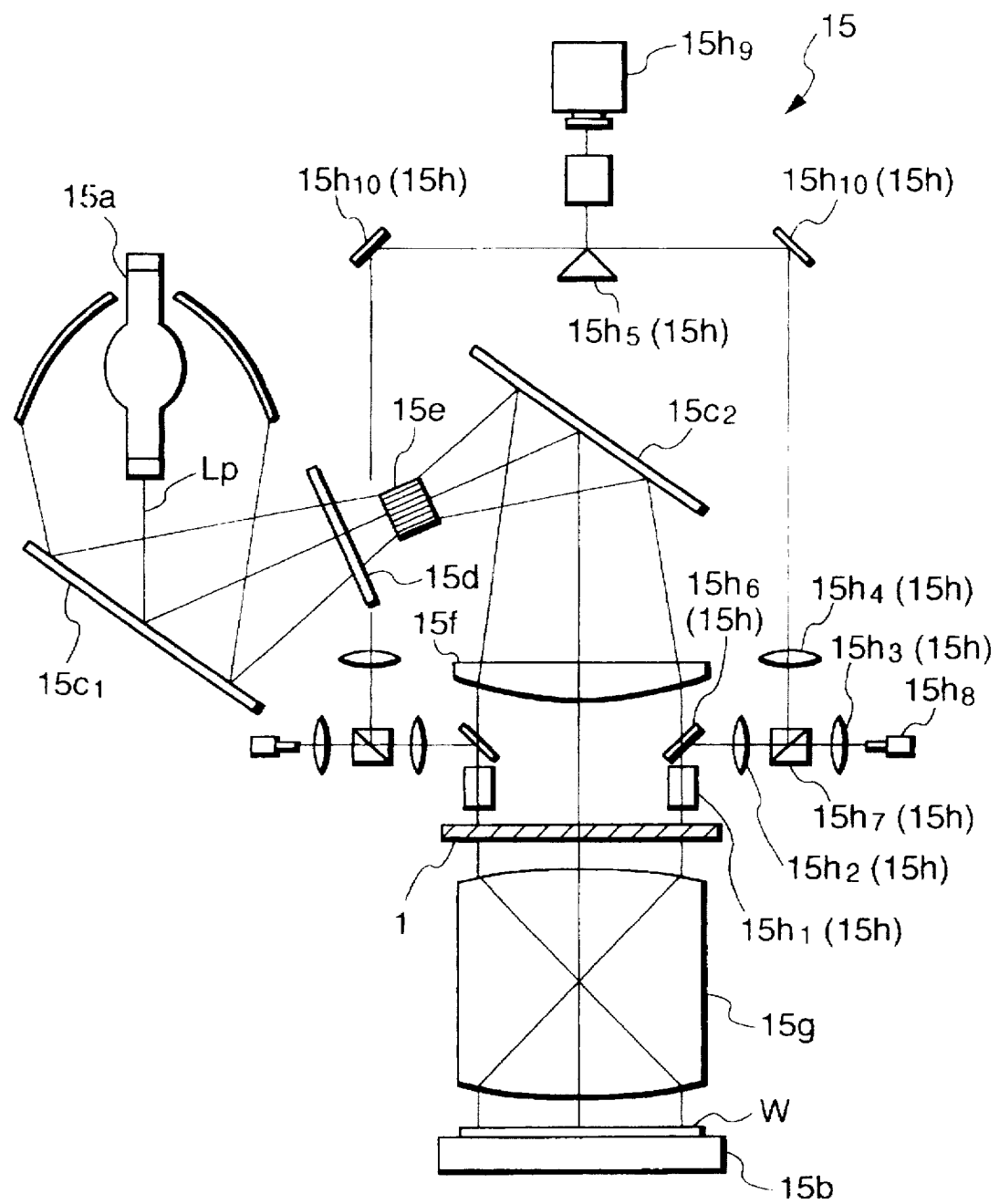
FIG. 24 is an explanatory diagram of a reducing exposure system.

In FIG. 24, while the photomask 1 and the semiconductor wafer W are being synchronously moved together by measuring their positional coordinates in high accuracy by the laser interferometry, the excimer laser beam is applied to the surface of the photomask 1 to scan the exposed region on the photomask 1. In response to this, the pattern over the photomask 1 is projected at a reduced ratio upon the photoresist film surface on the semiconductor wafer W.

Specifically, the exposure is performed to correspond to the diameter of the reduced projection lens so that the exposed chip size is effectively enlarged to 2½ times. If this method is adopted, however, the exposure throughput drops. In order to prevent this drop, there is adopted a method by which the reduction ratio is changed from x5 to x4. The light source is exemplified by a KrF excimer laser (having a wavelength of 248 nm).

In order to cope with this step & scan exposure, it is necessary to extract a finer pattern defect than that of the x5 reducing projection method of the prior art. Despite of this necessity, the defect extraction and discrimination can be facilitated by the inspection method of Embodiment 1.

Here will be described the exposure method of the present embodiment. Incidentally, the description of the present embodiment will be made upon the exposure method in connection with the wiring pattern, the gate electrode pattern and the specific semiconductor integrated circuit device process.

Figure 25:
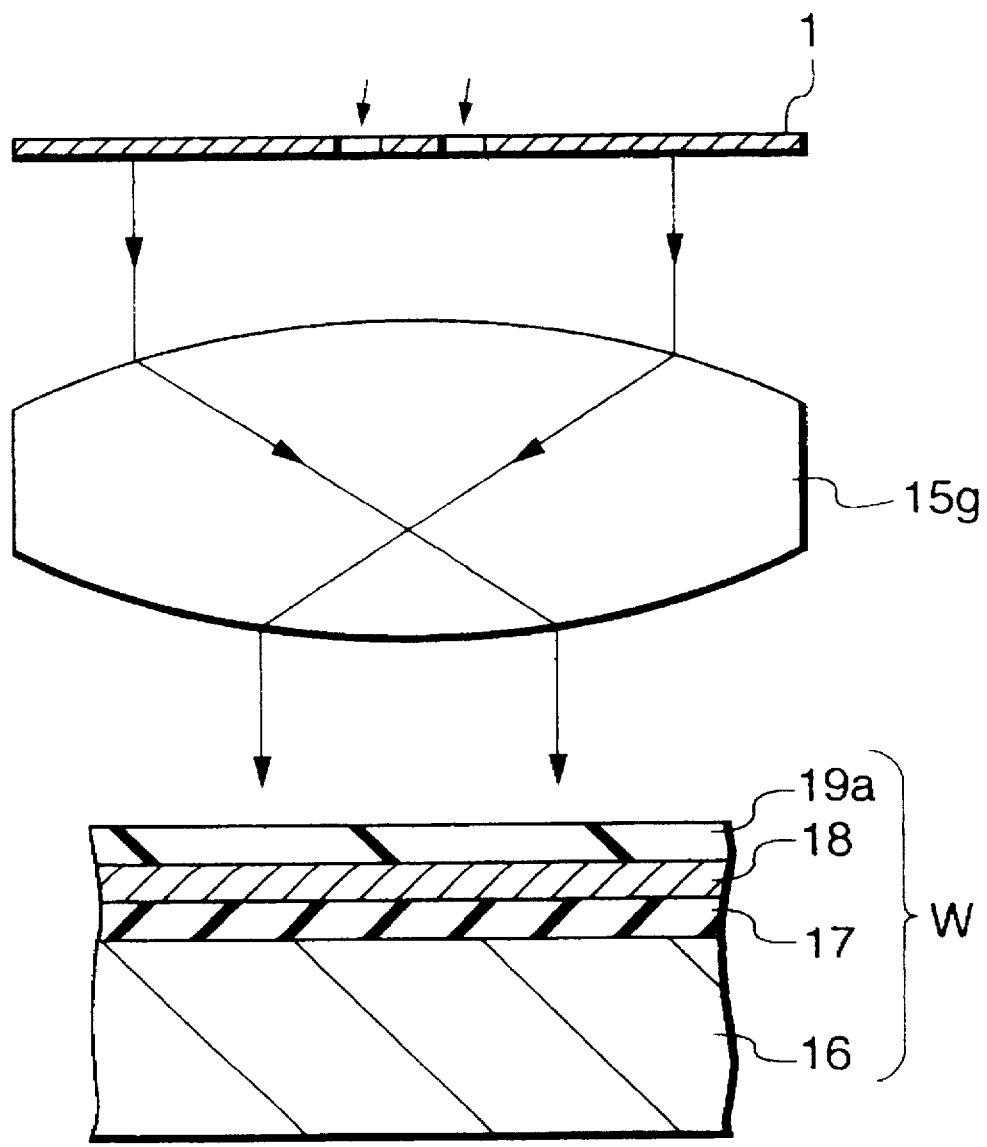
FIG. 25 is a section of an essential portion of a semiconductor substrate for explaining an exposure method or a process for manufacturing a semiconductor integrated circuit device.

First of all the method of exposing the wiring pattern will be described with reference to FIGS. 25 to 27. Over a semiconductor substrate 16 of the semiconductor wafer W to be exposed, as shown in FIG. 25, there is formed by the CVD method or the like an insulating film 17 made of $SiO_2$, for example, over which is formed a metal film of aluminum or the like by the sputtering method or the vapor deposition method.

A negative type photoresist film 19a having a thickness of about 0.6 μm, for example, is deposited at first on the metal film 18 of that semiconductor wafer W, and this semiconductor wafer W is subjected to a baking treatment.

Subsequently, the photomask 1 and the semiconductor wafer W are arranged in predetermined positions of the reducing projection exposure system 15 (as shown in FIG. 24), and the exposure light LP is emitted from the exposure light source 15a. The photoresist film 19a of the semiconductor wafer W is exposed to that emitted light LP through the photomask 1.

After this, the semiconductor wafer W is taken out from the reducing projection exposure system 15 and is then subjected to the baking treatment.

Figure 26:
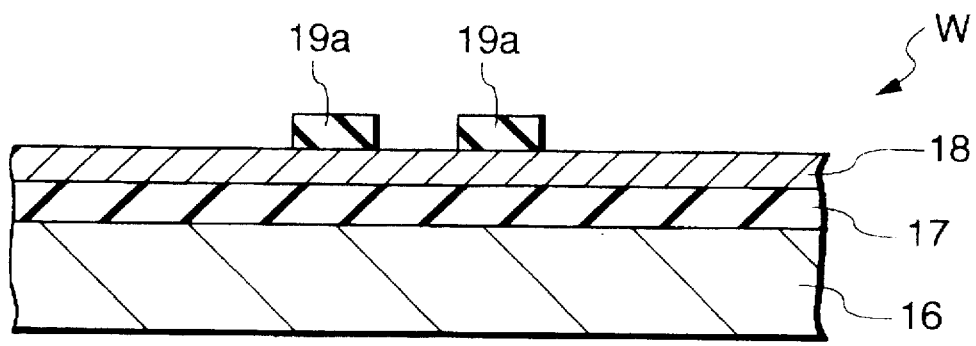
FIG. 26 is a section of an essential portion of a semiconductor substrate for explaining an exposure method or a semiconductor integrated circuit device manufacturing step subsequent to FIG. 25.

Subsequently, the photoresist film 19a over the semiconductor wafer W is subjected to a developing treatment to form its pattern, as shown in FIG. 26. This pattern of the photoresist film 19a is one for forming the wiring pattern and extends normal to the paper surface of FIG. 26.

Figure 27:
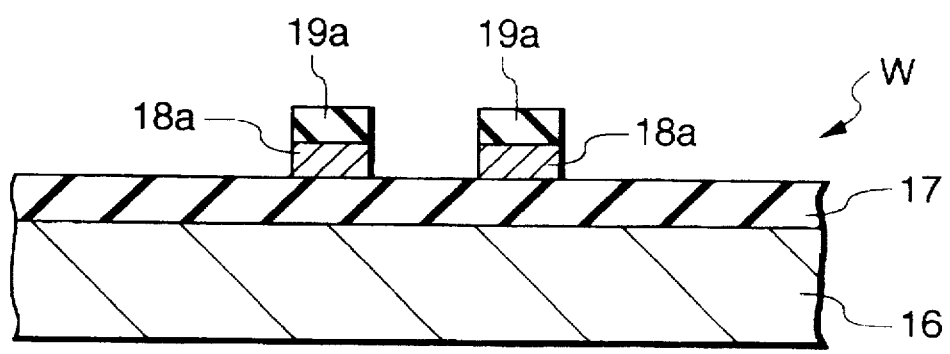
FIG. 27 is a section of an essential portion of a semiconductor substrate for explaining an exposure method or a semiconductor integrated circuit device manufacturing step subsequent to FIG. 26.

Subsequently, the pattern of the photoresist film 19a is used as the etching mask to etch the semiconductor wafer W so that the portion of the metal film 18, as exposed from the pattern of the photoresist film 19a, is etched out to form a wiring pattern 18a made of a metal film left over the semiconductor wafer W, as shown in FIG. 27.

The method of forming the gate electrode pattern will be described in the following with reference to FIGS. 28 to 33.

First of all, a gate forming film made of polycrystalline silicon, for example, is deposited by the sputtering method or the like on the gate insulating film of a semiconductor substrate. After this, a positive type photoresist film, for example, is applied to the gate forming film by the spin application method or the like.

Subsequently, the photomask 1 and the semiconductor wafer W are placed on the reducing projection exposure system 15 (as shown in FIG. 24), and the semiconductor wafer W is subjected to the exposing treatment in the aforementioned manner. In this treatment, the photomask 1, as shown in FIGS. 28 and 29, is continuously exposed.

Figure 28:
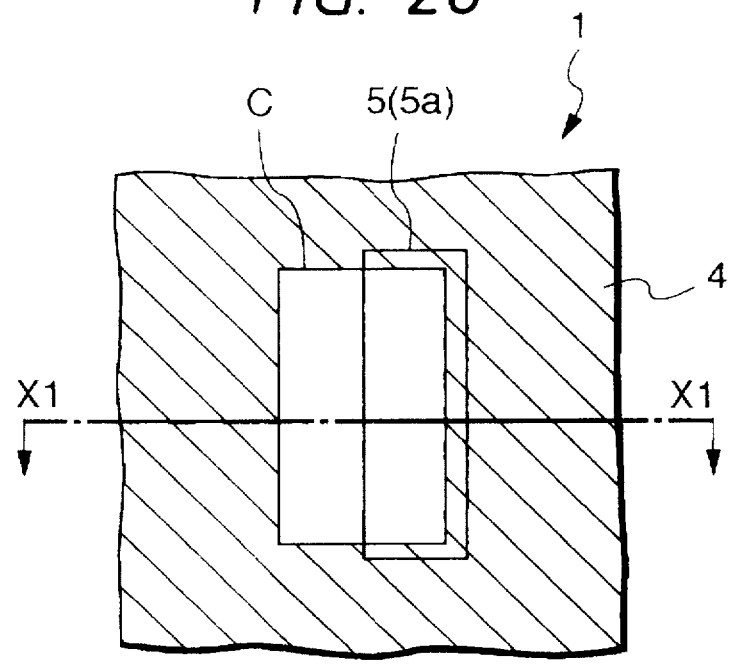
FIG. 28 is a top plan view of an essential portion of the photomask to be used at an exposure step or a step of manufacturing the semiconductor integrated circuit device.
Figure 30:
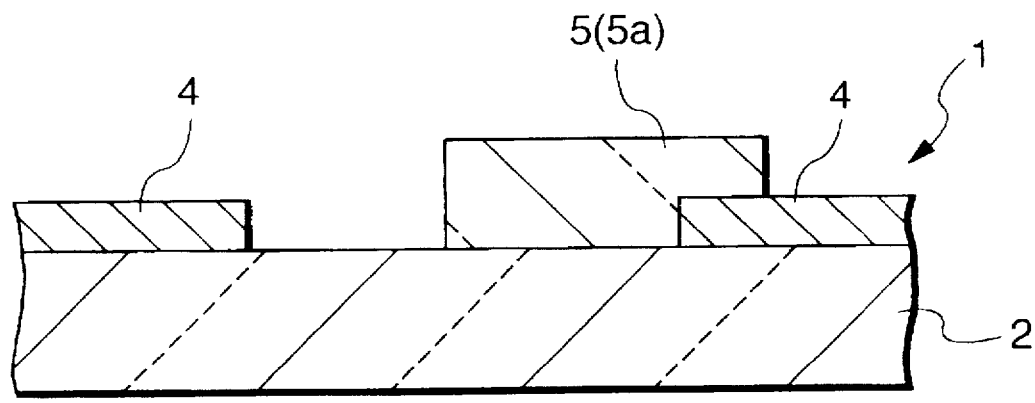
FIG. 30 is a section taken along line X1—X1 of FIG. 28.

In the photomask 1, as shown in FIGS. 28 and 30, the edge portion of the phase shifter pattern 5 is present in the transparent region C which is opened in a square shape in the shield pattern 4. Here, FIG. 30 is a section taken along line X1 to X1 of FIG. 28.

Figure 29:
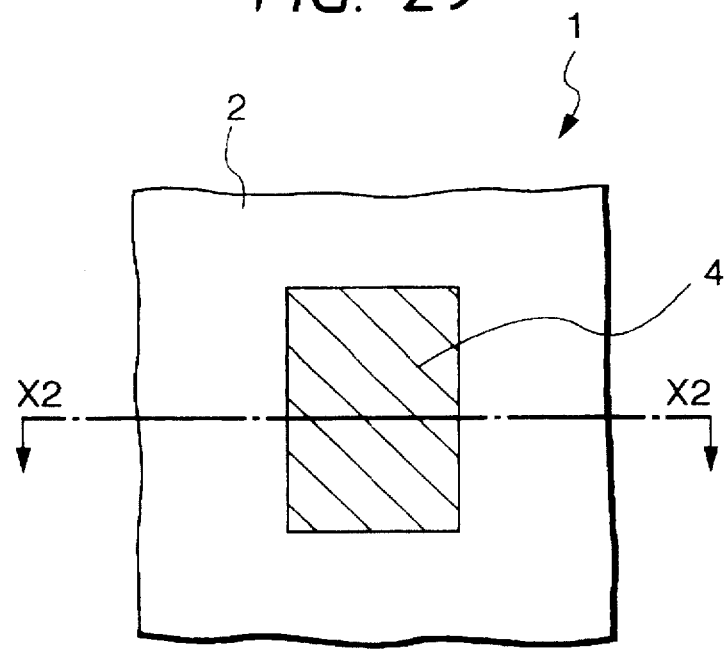
FIG. 29 is a top plan view of an essential portion of the photomask to be used at an exposure step or a step of manufacturing the semiconductor integrated circuit device.
Figure 31:
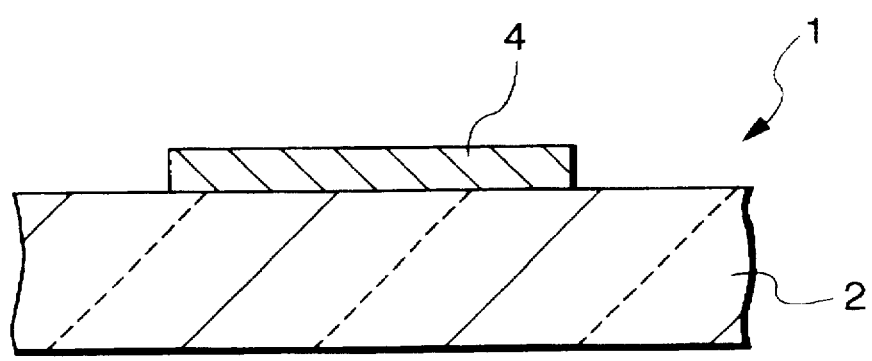
FIG. 31 is a section taken along line X2—X2 of FIG. 29.

On the other hand, FIGS. 29 and 31 show the case in which a square-shaped isolated shield pattern 4 is arranged in the mask substrate 2. The shield pattern 4 has a size equal to that of the transparent region C of FIG. 28. Here, FIG. 31 is a section taken along line X2—X2 of FIG. 29.

Figure 32:
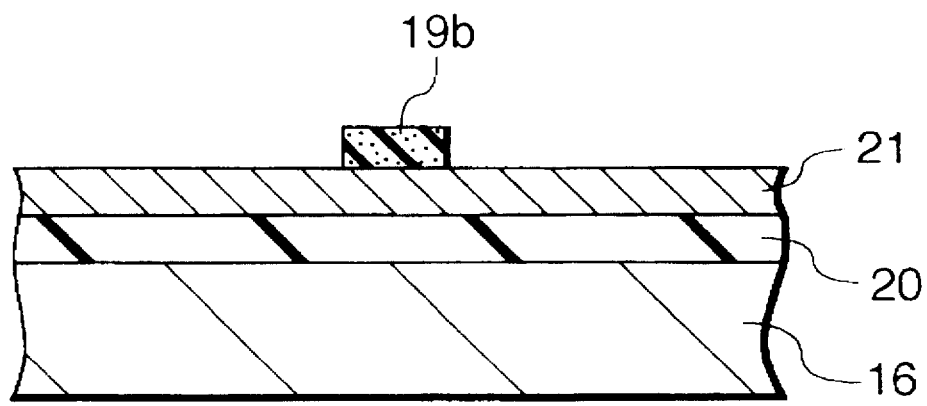
FIG. 32 is a section of an essential portion of a semiconductor substrate for explaining an exposure method or a process for manufacturing a semiconductor integrated circuit device.

After this, the semiconductor wafer W is taken out from the reducing projection exposure system 15 (as shown in FIG. 24) and subjected to the baking treatment and then the developing treatment. As a result, it is possible to form the pattern of a photoresist film 19b having a minute width, as shown in FIG. 32. Incidentally, reference numeral 20 designates the aforementioned gate insulating film.

Figure 33:
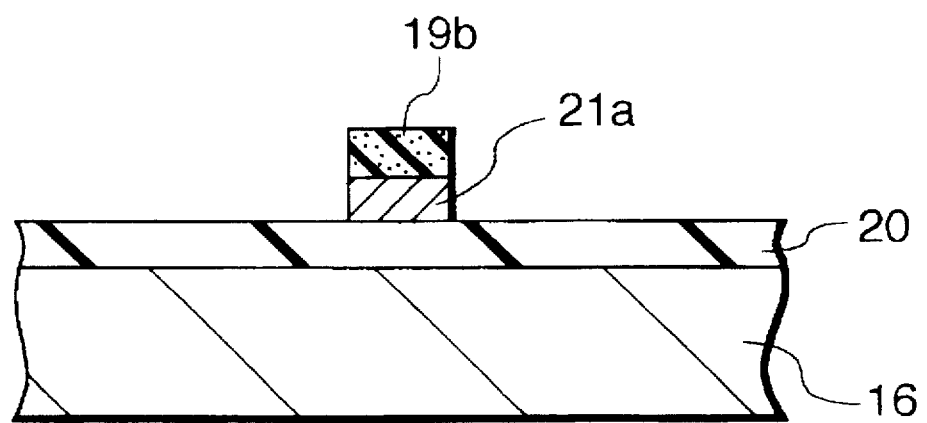
FIG. 33 is a section of an essential portion of a semiconductor substrate for explaining an exposure method or a semiconductor integrated circuit device manufacturing step subsequent to FIG. 32.

After this, the pattern of the photoresist film 19b is used as the mask to etch out the portion of a gate forming film 21, as exposed from the pattern of the photoresist film 19b, thereby to form a gate electrode 21a, as shown in FIG. 33. This gate electrode 21a has a channel-direction size of about 0.28 μm.

With reference to FIGS. 34 to 41, the present invention will be described in case it is applied to a process for manufacturing a twin-well type CMOS-SRAM, for example.

Figure 34:
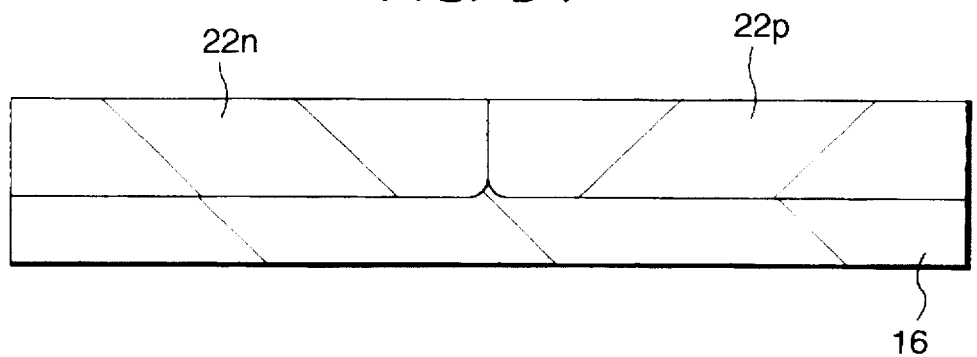
FIG. 34 is a section of an essential portion of a semiconductor substrate for explaining an exposure method or a process for manufacturing a semiconductor integrated circuit device.

FIG. 34 is a section of an essential portion of the semiconductor substrate 16 being manufactured. This semiconductor substrate 16 is made of an n⁻-type silicon (Si) single crystal which has an n-well 22n and a p-well 22p formed in its upper portion. The n-well 22n is doped with an n-type impurity such as phosphor or As. On the other hand the p-well 22p is doped with a p-type impurity such as boron.

Figure 35:
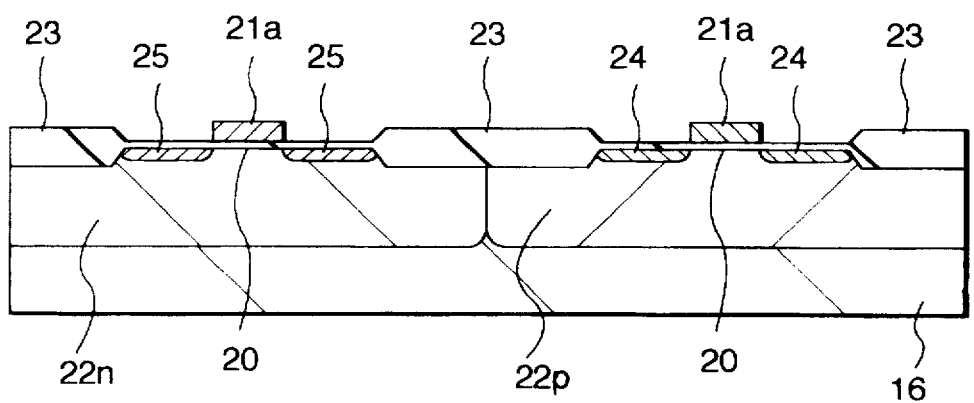
FIG. 35 is a section of an essential portion of a semiconductor substrate for explaining an exposure method or a semiconductor integrated circuit device manufacturing step subsequent to FIG. 34.

Subsequently, a field insulating film 23 made of $SiO_2$, for example, is formed over the principal surface of the semiconductor substrate 16 by the LOCOS (Local Oxidization of Silicon) method or the like, as shown in FIG. 35. After this, the gate insulating film 20, as made of SiO$_2$, is formed by the thermal oxidation method or the like in the element forming region, as enclosed by the field insulating film 23.

Subsequently, a gate forming film, as made of low-resistance poly-silicon, is deposited upon the semiconductor substrate 16 by the CVD method or the like. After this, that film is patterned to form the gate electrodes 21a by the photolithography technique and the etching technique.

After this, an n-channel type MOS•FET forming region is doped with an n-type impurity such as phosphor or arsenic by the ion implantation method. At this time, the gate electrodes 21a are used as the mask to dope the semiconductor substrate 16 in self-alignment with the n-type impurity.

Subsequently, a p-channel type MOS•FET forming region is doped with a p-type impurity such as boron by the ion implantation method. At this time, the gate electrodes 21a are used as the mask to dope the semiconductor substrate 16 in self-alignment with the p-type impurity.

After this, the semiconductor substrate 16 is subjected to a heat treatment to form not only n-type semiconductor regions 24 forming the source region and drain region of the n-channel type MOS•FET but also p-type semiconductor regions 25 forming the source region and drain region of the p-channel type MOS•FET.

Figure 36:
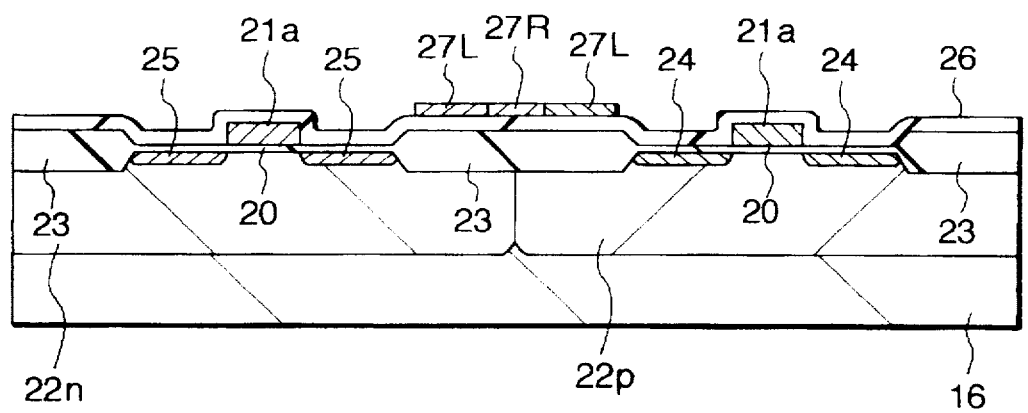
FIG. 36 is a section of an essential portion of a semiconductor substrate for explaining an exposure method or a semiconductor integrated circuit device manufacturing step subsequent to FIG. 35.
Figure 37:
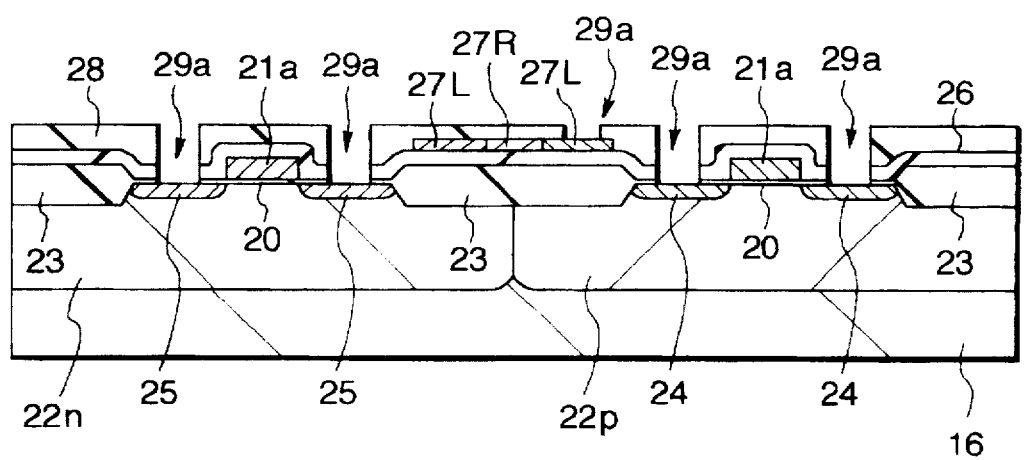
FIG. 37 is a section of an essential portion of a semiconductor substrate for explaining an exposure method or a semiconductor integrated circuit device manufacturing step subsequent to FIG. 36.

Next, a layer insulating film 26, as made of SiO$_2$, is deposited on the semiconductor substrate 16 by the CVD method or the like, as shown in FIG. 36. After this, a poly-silicon film is deposited on the upper surface of the layer insulating film 26 by the CVD method or the like.

Subsequently, the poly-silicon film is patterned by the photolithography technique and the etching technique. AFter this, the predetermined regions of the patterned poly-silicon film are doped with an impurity to form lines 27L and resistors 27R of the poly-silicon film.

After this, an insulating film 28, as made of SiO$_2$, is deposited on the semiconductor substrate 16 by the SOG (Spin On Glass) method. After this, connection holes 29a are opened in the insulating film 28 to expose the semiconductor regions 24 and 25 and the wiring lines 27L partially by the photolithography technique and the etching technique.

Figure 38:
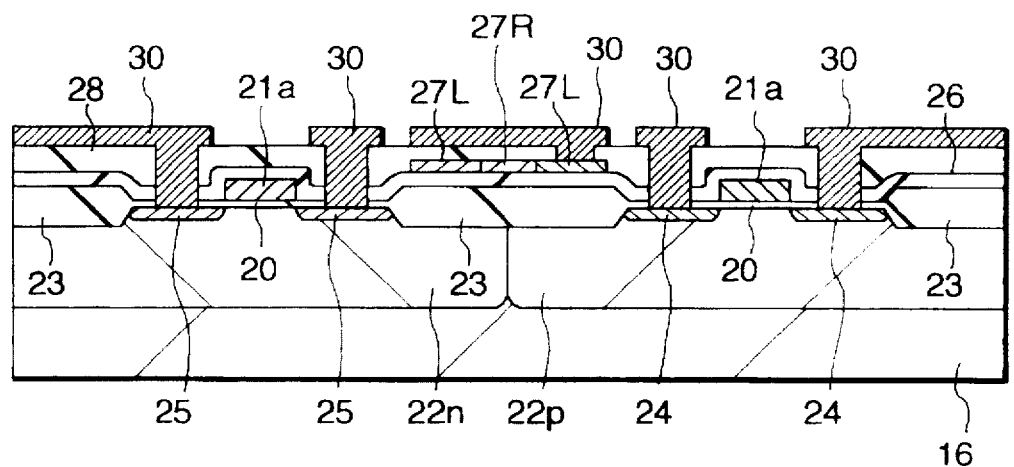
FIG. 38 is a section of an essential portion of a semiconductor substrate for explaining an exposure method or a semiconductor integrated circuit device manufacturing step subsequent to FIG. 37.

Next, a metal film, as made of Al, is deposited on the semiconductor substrate 16 by the sputtering method or the like. After this, the metal film is patterned by the photolithography technique or the etching technique to form a first-layer wiring line 30, as shown in FIG. 38.

Figure 39:
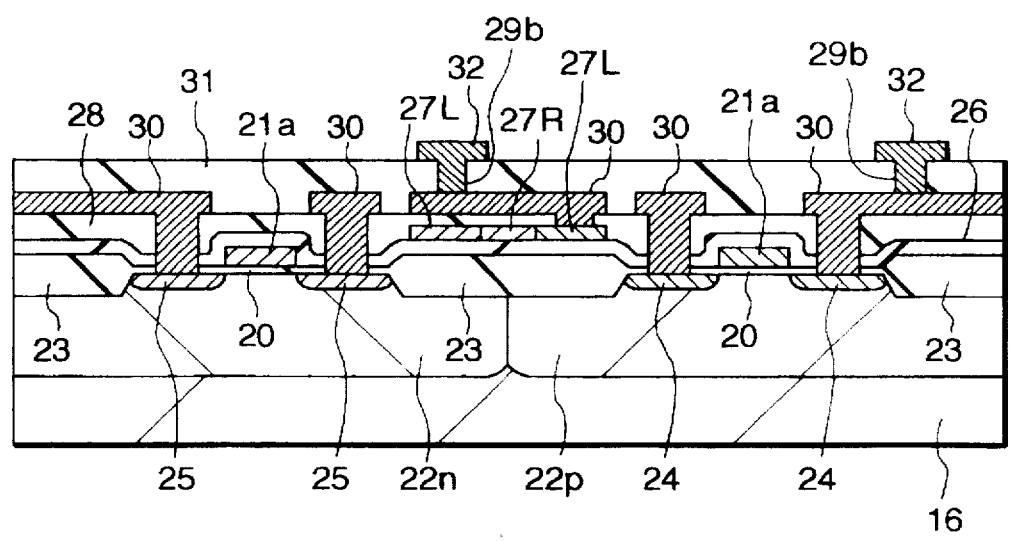
FIG. 39 is a section of an essential portion of a semiconductor substrate for explaining an exposure method or a semiconductor integrated circuit device manufacturing step subsequent to FIG. 38.

Subsequently, a layer insulating film 31, as made of SiO$_2$, is deposited on the semiconductor substrate 16 by the CVD method or the like, as shown in FIG. 39. After this, connection holes 29b are opened in a portion of the insulating film 31 to expose the first-layer wiring line 30 partially.

Figure 40:
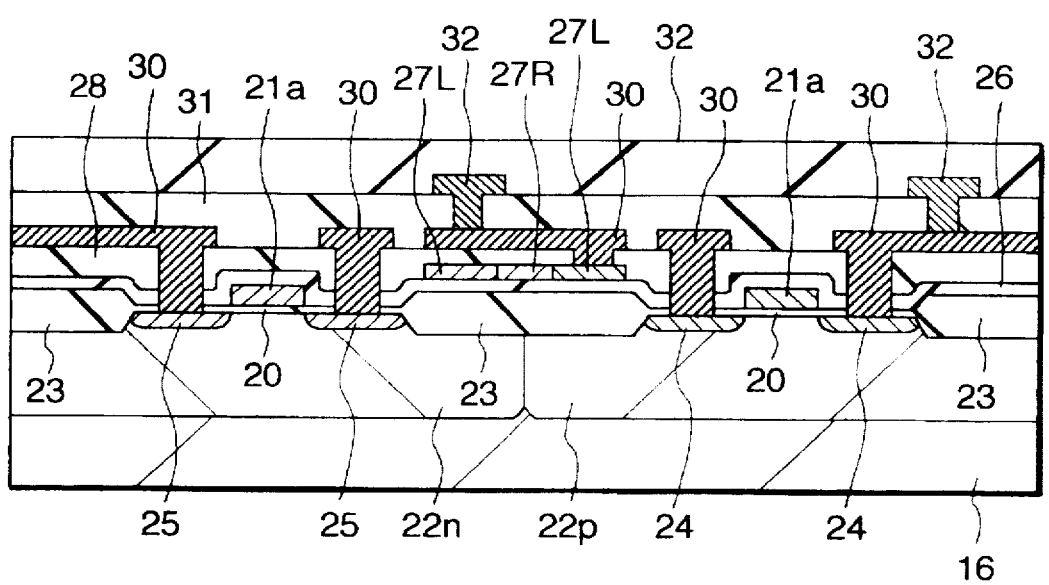
FIG. 40 is a section of an essential portion of a semiconductor substrate for explaining an exposure method or a semiconductor integrated circuit device manufacturing step subsequent to FIG. 39.

After this, a metal film, as made of Al, is deposited on the semiconductor substrate 16 by the sputtering method. After this, the metal layer is patterned by the photolithography technique and the etching technique to form a second-layer wiring line 32. After this, a surface protecting film 33, as made of SiO$_2$, is deposited on the semiconductor substrate 16 by the CVD method or the like, as shown in FIG. 40.

Figure 41:
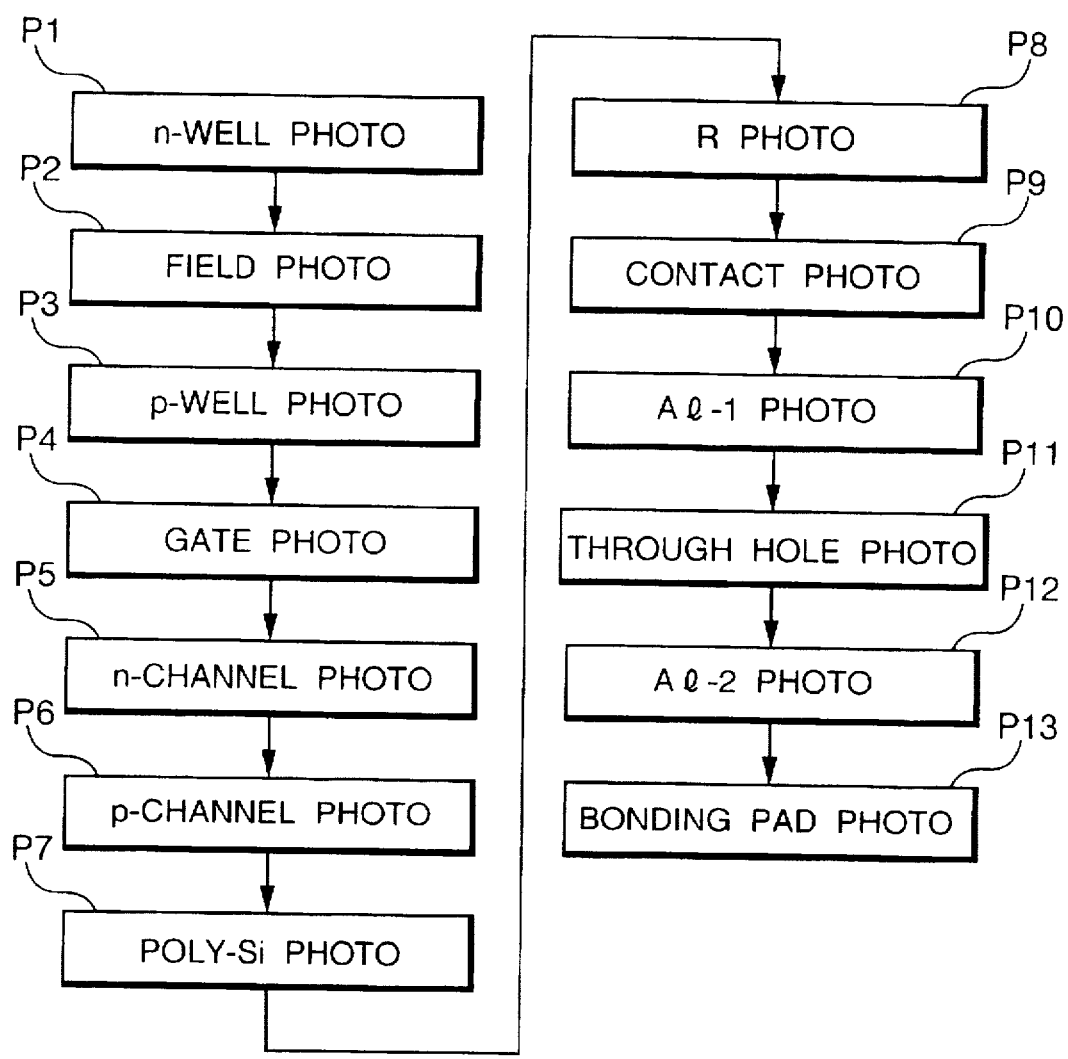
FIG. 41 is a flow chart for explaining an exposure method or a process for manufacturing the semiconductor integrated circuit device.

FIG. 41 is a flow chart of the exposure process, in which the photolithography step or the exposure step in the process of manufacturing the aforementioned SRAM is extracted and illustrated in a flow routine.

In FIG. 41, at an n-well photo step P1, an insulating film, as made of silicon nitride, is deposited on the semiconductor substrate, and a photoresist pattern is so formed over the insulating film as to coat the region other than the n-well forming region.

At a field photo step P2, an insulating film, as made of silicon nitride, is deposited on the semiconductor substrate, and a photoresist pattern is so formed over the insulating film as to coat only the element forming region.

At a p-well photo step P3, a photoresist pattern for coating the n-well is formed to form a p-well channel stopper region.

At a gate photo step P4, a conductor film, as made of poly-silicon, is deposited on the semiconductor substrate, and a photoresist pattern is so formed over the conductor film as to coat the gate electrode forming region.

At an n-channel photo step P5, a photoresist pattern is formed to cover the p-channel side so that an n-channel side may be doped with ions of an n-type impurity by using the gate electrodes as the mask.

At a p-channel photo step P6, a photoresist pattern is formed to cover the n-channel side so that the p-channel side may be doped with ions of a p-type impurity by using the gate electrodes as the mask.

At a polycrystalline silicon photo step P7, a photoresist pattern is formed to coat the polycrystalline silicon film, which is deposited on the semiconductor substrate, with the wiring lines and the resistive region so that the second-layer polycrystalline silicon film for forming the wiring lines and the resistors may be patterned.

At an R photo step P8, with the photoresist pattern being formed on the resistors, the photoresist pattern for acting as the mask to dope other regions with an impurity is patterned by a negative process.

At a contact photo step P9, the photoresist pattern for forming the connection holes is formed by the positive process. At an Al-1 photo step P10, the first-layer wiring line is patterned. At a through hole photo step P11, there is formed a photoresist pattern for opening the connection holes for connecting the first-layer wiring line and the second-layer wiring line.

At an Al-2 photo step P12, the second-layer wiring line is patterned. At a bonding pad photo step P13, the holes of about 100 μm, as corresponding to the bonding pads, are opened in the surface protecting film, and the photoresist pattern for coating the regions other than the bonding pad forming regions is formed over the surface protecting film.

Of these exposure steps, generally speaking, the n-well photo step P1, the n-channel photo step P5, the p-channel photo step P6 and the bonding pad photo step P13 need not use the phase shift mask because their minimum sizes are relatively large. At the remaining photo steps, however, the phase shift mask of the present invention is used for the exposure.

Especially at the gate photo step P4, the gate electrodes are formed by using a chemical magnification type negative photoresist. At the contact photo step P9, moreover, the connection holes are opened by using a chemical magnification type positive photoresist. As a result, the gate length of the gate electrodes and the numerical aperture of the connection holes can be made as fine as the wavelength (e.g., about 0.3 μm) or less of the exposure light to be used in the optical exposure method.

Thus, the following effects can be achieved according to Embodiment 1.

(1) By dividing the step of inspecting the photomask 1, according to Embodiment 1, a plurality of photomasks 1 can be so separately inspected that an arbitrary photomask 1 can be inspected at the anomaly extracting step, that another photomask 1 having ended the anomaly extracting step can be inspected at the first propriety decision step, and that still another photomask 1 having ended the anomaly extracting step can be inspected at the second propriety decision step. In short, the inspection of the photomask 1 can be prevented from stagnating at one inspection step so that the plurality of photomasks 1 can be efficiently executed. As a result, it is possible to drastically shorten the time period for manufacturing a highly reliable photomask 1 capable of transferring a fine pattern.

(2) By dividing the inspection step of the photomask 1, the inspecting optical systems can be arranged suitably for the individual inspections so that the inspection accuracies at the individual inspection steps can be drastically improved.

(3) Thanks to the aforementioned effect (2), it is possible to provide the highly reliable photomask 1 capable of transferring the fine patterns. As a result, the semiconductor integrated circuit device is manufactured by using that photomask 1, the pattern transfer defectiveness in the exposure process can be reduced to improve the production yield and reliability of the semiconductor integrated circuit device.

(4) Thanks to the divided individual inspection steps, the data can be divided for the individual inspection steps to lighten the loads upon the data in the inspecting apparatus. As a result, the data processing rate can be improved to improve the inspection efficiency.

(5) Thanks to the divided individual inspection steps, it is possible to eliminate the unnecessary inspections. If the anomaly extraction step encounters the case, in which it is decided that no subsequent inspection is required, or the case in which there is discovered a region requiring no subsequent inspection, it is possible by transmitting the data to the first propriety decision step or the second propriety decision step to eliminate the first propriety decision step and the second propriety decision step all over the region of the photomask 1 or in a partial region of the photomask 1. As a result, it is possible to improve the inspection efficiency.

(6) According to the process for manufacturing the photomask 1 of the present invention, when the mask substrate 2 having a predetermined transparent region, in which the edge portion of the phase shifter pattern 5 is arranged, is to be inspected, there are prepared the data of the pattern, in which the transparent region is divided, and it is inspected whether or not the phase shifter pattern 5 is present in one of the divided regions. As a result, it is possible to prevent the erroneous inspection which might otherwise decide that the pattern is defective due to the fact that the pattern interval is less than the exposable interval. As a result, the inspection of the photomask 1 having the phase shifter pattern 5 can be executed without deciding that the transparent region, in which the edge portion of the phase shifter pattern 5 is to be arranged, is not defective. As a result, it is possible to improve the inspection efficiency.

(7) According to the process for manufacturing the photomask 1 of the present invention, at the inspection of the photomask 1, in the transparent region in which the edge portion of the phase shifter pattern is arranged, the width of the pattern in the boundary region between the light having passed through the phase shifter pattern 5 and the light having passed through the transparent region not having the phase shifter pattern 5. On the basis of this, the data of a deciding pattern are prepared so that the erroneous inspection to misjudge a defect due to the different widths for the individual products can be prevented. As a result, the inspection of the photomask 1 having the phase shifter pattern 5 can be executed without deciding that the transparent region, in which the edge portion of the phase shifter pattern 5, is defective. As a result, it is possible to improve the inspection efficiency.

[EMBODIMENT 2]

Figure 42:
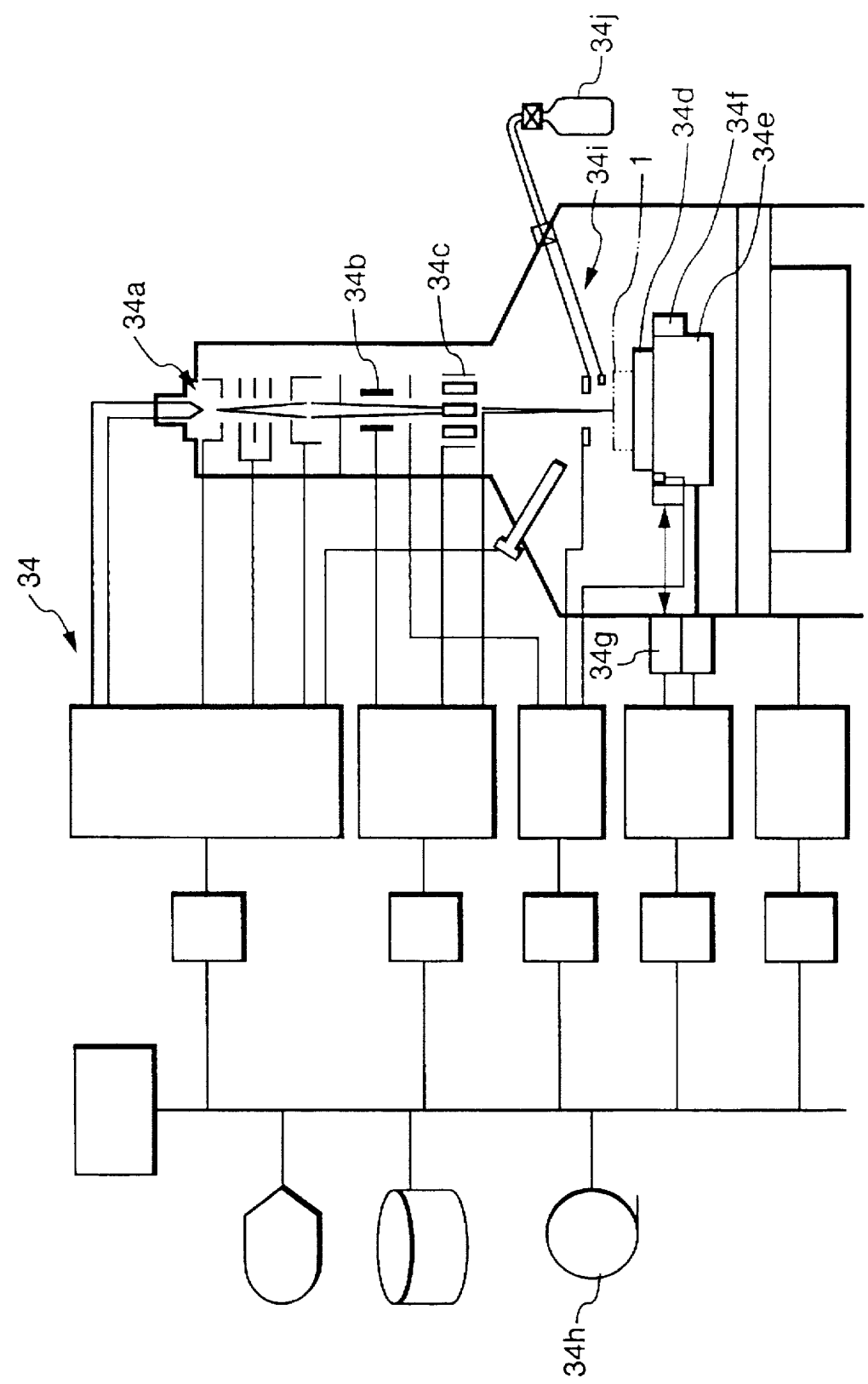
FIG. 42 is an explanatory diagram of a focused ion beam apparatus to be used in a photomask manufacturing method according to another embodiment of the present invention.

FIG. 42 is an explanatory diagram of a focused ion beam apparatus to be used in a photomask manufacturing method according to another embodiment of the present invention.

In Embodiment 2, here will be described a modification of the invention in which a groove-shaped phase shifter pattern is to be formed in the photomask 1.

An example of the focusing ion beam apparatus to be used in Embodiment 2 is shown in FIG. 42. The ion beam, as emitted from an ion source 34a of a focusing ion beam device 34, is controlled by a blanking electrode 34b and a deflecting electrode 34c and is applied to the photomask 1. The ion beam is focused to a diameter of about 0.1 μm and is applied to a predetermined working region. The photomask 1 is held by a holder 34d and on a sample bed 34e. This sample bed 34e is recognized on its positional coordinates through a laser mirror 34f at its side by a laser interferometry length measuring device 34g so that it is aligned. To this focusing ion beam apparatus, there are inputted the data of the position to be worked, by a data input device such as a magnetic tape 34h. This apparatus is equipped with a gas nozzle 34i for applying a gas to the ion beam applied portion. The gas nozzle 34i is connected through an ON/OFF valve to a gas bomb 34j. As a result, the gas can be added before the working to effect the working with the ion beam.

If a spin-on glass film (SOG) is used in the phase shifter, for example, this shifter removes the portion, which is unworked to an excess region, by using the aforementioned gas-applied focused ion beam so that the etching selection ratio to the glass substrate can be improved.

Here will be described the process for manufacturing the photomask 1 of Embodiment 2. Incidentally, the description to be made herein will resort to FIGS. 20 to 22, as used in Embodiment 1.

First of all, a portion of the mask substrate 2 is sputtered out by applying the focused ion beam to a predetermined position of the transparent region of the mask substrate 2, as shown in FIG. 20, so that the grooves 5b1 having a depth of about 90% of the predetermined depth is formed in the mask substrate 2 by setting the ion beam application time or the number of scanning times.

The working technique using this focused ion beam is disclosed in Japanese Patent Application No. 247100/1990, for example. However, the working rate can be improved by adding an etching promoting gas to the surface of the photomask 1 before applying the ion beam.

Next, the method of Embodiment 1 is used like before, as shown in FIG. 21, to measure the phase difference optically with respect to the applied region and the unapplied region thereby to determine an error from the predetermined phase difference.

Subsequently, the focused ion beam is applied again to the aforementioned region. The amount of application is determined depending upon the aforementioned error from the predetermined phase difference. In this instance, the damage is made smaller than that of the first ion beam application case by applying the ion beam while adding a xenon fluoride gas, for example. As a result, the grooves 5b of a predetermined depth can be formed in the mask substrate 2, as shown in FIG. 22. According to this method, the grooves 5b, as intrinsically used for the phase shifter pattern, can be highly accurately corrected. The subsequent steps are similar to those of Embodiment 1.

In Embodiment 2, too, it is possible to achieve effects similar to those of Embodiment 1.

Although our invention has been specifically described in connection with its embodiments, it should not be limited to Embodiments 1 and 2 but can naturally be modified in various manners without departing from the gist thereof.

In the foregoing embodiments, for example, the description has been made upon the case in which a predetermined semiconductor integrated circuit pattern is to be transferred to the semiconductor wafer made of an Si single crystal. However, the present invention should not be limited thereto, but the present invention can also be applied to the case in which a predetermined semiconductor integrated circuit pattern is to be transferred to the semiconductor wafer made of a chemical semiconductor such as GaAs.

Although the foregoing description has been made upon the case in which our invention is applied to the photomask to be used in the process for manufacturing the SRAM backgrounding the present invention. Despite of this description, however, the present invention should not be limited thereto but can find various applications such as a photomask to be used in the process for exposing another semiconductor integrated circuit device such as a DRAM 'Dynamic RAM' or a microprocessor.

The effects to be obtained by a representative one of the invention to be disclosed herein will be briefly described in the following.

(1) By dividing the step of inspecting the photomask, according to the photomask manufacturing process of the present invention, a plurality of photomasks can be so separately inspected that an arbitrary photomask can be inspected at the anomaly extracting step, that another photomask having ended the anomaly extracting step can be inspected at the first propriety decision step, and that still another photomask having ended the anomaly extracting step can be inspected at the second propriety decision step. As a result, the inspection of the photomask can be prevented from stagnating at one inspection step so that the plurality of photomasks can be efficiently executed. As a result, it is possible to drastically shorten the time period for manufacturing a highly reliable photomask capable of transferring a fine pattern.

(2) Thanks to the divided individual inspection steps, the inspecting optical systems can be arranged suitably for the individual inspections so that the inspection accuracies at the individual inspection steps can be drastically improved.

(3) Thanks to the aforementioned effect (2), it is possible to provide the highly reliable photomask capable of transferring the fine patterns. As a result, the semiconductor integrated circuit device is manufactured by using that photomask, the pattern transfer defectiveness in the exposure process can be reduced to improve the production yield and reliability of the semiconductor integrated circuit device.

(4) Thanks to the divided individual inspection steps, the data can be divided for the individual inspection steps to lighten the loads upon the data in the inspecting apparatus. As a result, the data processing rate can be improved to improve the inspection efficiency.

(5) Thanks to the divided individual inspection steps, it is possible to eliminate the unnecessary inspections. If the anomaly extraction step encounters the case, in which it is decided that no subsequent inspection is required, or the case in which there is discovered a region requiring no subsequent inspection, it is possible by transmitting the data to the first propriety decision step or the second propriety decision step to eliminate the first propriety decision step and the second propriety decision step all over the region of the photomask or in a partial region of the photomask. As a result, it is possible to improve the inspection efficiency.

(6) According to the process for manufacturing the photomask of the present invention, when the mask substrate having a predetermined transparent region, in which the edge portion of the phase shifter pattern is arranged, is to be inspected, there are prepared the data of the pattern, in which the transparent region is divided, and it is inspected whether or not the phase shifter pattern is present in one of the divided regions. As a result, it is possible to prevent the erroneous inspection which might otherwise decide that the pattern is defective due to the fact that the pattern interval is less than the exposable interval. As a result, the inspection of the photomask having the phase shifter pattern can be executed without deciding that the transparent region, in which the edge portion of the phase shifter pattern is to be arranged, is not defective. As a result, it is possible to improve the inspection efficiency.

(7) According to the process for manufacturing the photomask of the present invention, at the inspection of the photomask, in the transparent region in which the edge portion of the phase shifter pattern is arranged, the width of the pattern in the boundary region between the light having passed through the phase shifter pattern and the light having passed through the transparent region not having the phase shifter pattern. On the basis of this, the data of a deciding pattern are prepared so that the erroneous inspection to misjudge a defect due to the different widths for the individual products can be prevented. As a result, the inspection of the photomask having the phase shifter pattern can be executed without deciding that the transparent region, in which the edge portion of the phase shifter pattern, is defective. As a result, it is possible to improve the inspection efficiency.

We claim:

1. A method of manufacturing a phase shifting mask using one or more phase shifter edges as a part of a circuit pattern for transferring the circuit pattern onto an integrated circuit wafer by optical reduction projection exposure, the mask having a plurality of first transmission regions, each of which has a shifter edge portion therein, the method comprising the steps of:

(a) transforming the edge portion within each of the first transmission regions into a shield region by substituting a virtual shield region of a predetermined width for the edge portion on mask pattern data;

(b) optically capturing a two dimensional image of the phase shifting mask;

(c) comparing the image with the transformed mask pattern data, and thereby extracting defects in a circuit pattern over the mask; and (d) in accordance with the result of the defect extraction, repairing at least a part of the extracted defects.

2. A method of manufacturing a phase shifting mask using a phase shifter edge as a part of a circuit pattern for transferring the circuit pattern onto an integrated circuit wafer by optical reduction projection exposure, the mask having a plurality of first transmission regions, each of which has a shifter edge portion therein, the method comprising the steps of:

(a) transforming each of the first transmission regions into a pair of divided transmission regions along the shifter edge on mask pattern data;

(b) verifying whether the phases of the pair of regions are inverted from each other with respect to each of the pairs of divided regions on the transformed mask pattern data;

(c) in accordance with the result of the verification, carrying out necessary correction to the verified mask pattern data; and (d) in accordance with the corrected mask pattern data or mask drawing data transformed therefrom, drawing the circuit pattern over the mask by electron beam exposure.

3. A method of manufacturing a phase shifting mask having a circuit pattern for transferring the circuit pattern onto an integrated circuit wafer by optical reduction projection exposure, the mask having a plurality of transmission regions, the method comprising the steps of:

(a) extracting first defect portions on the circuit pattern over the mask by inspecting the mask;

(b) classifying the extracted first defect portions into a first group to measure each phase value at a separate phase value measuring mask stage and a second group not to measure each phase value at the phase value measuring mask stage;

(c) after step (b), transferring the mask to the phase value measuring mask stage, and then measuring the phase value of each of the defect portions of the first group; and (d) in accordance with the result of the phase value measurement, repairing at least a part of the defect portions of the first group.

4. A method as recited in claim 3, wherein the classification step is carried out at a separate mask stage with respect to a mask stage at which the extraction step is carried out.

5. A method as recited in claim 4, wherein an inspection optical system of the classification step is substantially confocal.

6. A method as recited in claim 5, wherein the extraction step is carried out by comparing optically detected mask pattern data with mask design data or mask pattern data transformed therefrom.

7. A method as recited in claim 5, wherein the extraction step is carried out by comparing optically detected mask pattern data from a first part of the circuit pattern over the mask to be inspected with optically detected mask pattern data from a second part of the circuit pattern over the mask.

8. A method as recited in claim 4, wherein the extraction step is carried out by comparing optically detected mask pattern data with mask design data or mask pattern data transformed therefrom.

9. A method as recited in claim 4, wherein the extraction step is carried out by comparing optically detected mask pattern data from a first part of the circuit pattern over the mask to be inspected with optically detected mask pattern data from a second part of the circuit pattern over the mask.

10. A method as recited in claim 3, wherein an inspection optical system of the classification step is substantially confocal.

11. A method as recited in claim 10, wherein the extraction step is carried out by comparing optically detected mask pattern data with mask design data or mask pattern data transformed therefrom.

12. A method as recited in claim 10, wherein the extraction step is carried out by comparing optically detected mask pattern data from a first part of the circuit pattern over the mask to be inspected with optically detected mask pattern data from a second part of the circuit pattern over the mask.

13. A method as recited in claim 3, wherein the extraction step is carried out by comparing optically detected mask pattern data with mask design data or mask pattern data transformed therefrom.

14. A method as recited in claim 3, wherein the extraction step is carried out by comparing optically detected mask pattern data from a first part of the circuit pattern over the mask to be inspected with optically detected mask pattern data from a second part of the circuit pattern over the mask.

15. A method of manufacturing a phase shifting mask using one or more phase shifter edges as a part of a circuit pattern for transferring the circuit pattern over the mask onto an integrated circuit wafer by optical reduction projection exposure, the circuit pattern over the mask including a plurality of first transmission regions, each of which has a shifter edge portion therein, a plurality of second transmission regions, each of which has no shifter edge portions therein, and one or more light shield regions defining the first and second transmission regions, the method comprising the steps of:

(a) transforming the edge portion within each of the first transmission regions into a shield region by substituting a virtual shield region of a predetermined width for the edge portion on mask pattern data for mask design or mask fabrication;

(b) optically capturing an image of the circuit pattern of the phase shifting mask;

(c) comparing the image with the transformed mask pattern data, and thereby extracting defects in the circuit pattern over the mask; and (d) in accordance with the result of the defect extraction, repairing at least a part of the extracted defects.

16. A method as recited in claim 15, wherein steps (b) to (d) are carried out to at least the first and second transmission regions.

17. A method of manufacturing a phase shifting mask using a phase shifter edge as a part of a circuit pattern for transferring the circuit pattern onto an integrated circuit wafer by optical reduction projection exposure, the circuit pattern over the mask including a plurality of first transmission regions, each of which has a shifter edge portion therein, a plurality of second transmission regions, each of which has no shifter edge portions therein, and one or more light shield regions defining the first and second transmission regions, the method comprising the steps of:

(a) transforming each of the first transmission regions into a pair of divided transmission regions along the shifter edge on mask pattern data;

(b) verifying whether the phases of the pair of regions are inverted from each other with respect to each of pairs of the divided regions and second transmission regions, the spacing of which pairs is not larger than a predetermined lower limit value on the transformed mask pattern data;

(c) in accordance with the result of the verification, carrying out necessary correction to the verified mask pattern data; and (d) in accordance with the corrected mask pattern data or mask drawing data transformed therefrom, drawing the circuit pattern over the mask by electron beam exposure.

* * * * *